(12) United States Patent
Kang et al.

(10) Patent No.: US 12,713,596 B2
(45) Date of Patent: Aug. 18, 2026

(54) POLY-SILICON BASED WORD LINE FOR 3D MEMORY

(71) Applicant: Applied Materials, Inc., Santa Clara, CA (US)

(72) Inventors: Chang Seok Kang, Santa Clara, CA (US); Tomohiko Kitajima, San Jose, CA (US); Gill Yong Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 537 days.

(21) Appl. No.: 17/741,803

(22) Filed: May 11, 2022

(65) Prior Publication Data

US 2022/0367560 A1 Nov. 17, 2022

Related U.S. Application Data

(60) Provisional application No. 63/189,272, filed on May 17, 2021.

(51) Int. Cl.

*H10B 43/27* (2023.01)
*H10B 41/27* (2023.01)
(Continued)

(52) U.S. Cl.

CPC ............. *H10B 43/27* (2023.02); *H10B 41/27* (2023.02); *H10B 43/40* (2023.02); *H10B 43/50* (2023.02); *H10P 14/6684* (2026.01); *H10P 72/00* (2026.01)

(58) Field of Classification Search

CPC ........ H10B 43/27; H10B 41/27; H10B 43/40; H10B 43/50; H01L 21/02214; H01L 21/67; H01L 27/14692; H10F 39/016
See application file for complete search history.

(56) References Cited

U.S. PATENT DOCUMENTS 8,658,499 B2 2/2014 Makala et al.
9,960,045 B1 5/2018 Purayath
(Continued)

FOREIGN PATENT DOCUMENTS

KR 20100059655 A 6/2010
KR 20170028872 A 3/2017
(Continued)

OTHER PUBLICATIONS

Mack, Chris A., "Pattern Collapse", The Lithography Expert (Nov. 2006), Tutor55.doc: Version Aug. 10, 2006.
(Continued)

*Primary Examiner* — Steven B Gauthier
*Assistant Examiner* — Alvin L Lee
(74) *Attorney, Agent, or Firm* — Servilla Whitney LLC

(57) ABSTRACT

Memory devices and methods of manufacturing memory devices are provided. The device and methods described decrease the resistivity of word lines by forming word lines comprising low resistivity materials. The low resistivity material has a resistivity in a range of from 5 μΩcm to 100 μΩcm. Low resistivity materials may be formed by recessing the word line and selectively growing the low resistivity materials in the recessed portion of the word line. Alternatively, low resistivity materials may be formed by depositing a metal layer and silicidating the metal in the word line region and in the common source line region.

8 Claims, 19 Drawing Sheets

(51) Int. Cl.

| | |
|---|---|
| ***H10B 43/40*** | (2023.01) |
| ***H10B 43/50*** | (2023.01) |
| ***H10P 14/60*** | (2026.01) |
| ***H10P 72/00*** | (2026.01) |

(56) References Cited

U.S. PATENT DOCUMENTS 10,319,739 B2 6/2019 Purayath
10,325,923 B2 6/2019 Purayath
10,354,916 B2 7/2019 Chen et al.
10,410,869 B2 9/2019 Roy et al.
10,468,259 B2 11/2019 Purayath et al.
10,529,737 B2 1/2020 Purayath
10,541,246 B2 1/2020 Purayath
10,553,604 B2 2/2020 Lu et al.
10,622,251 B2 4/2020 Chen et al.
10,790,298 B2 9/2020 Purayath
10,886,172 B2 1/2021 Chen
10,964,717 B2 3/2021 Kang et al.
10,998,329 B2 5/2021 Koshizawa et al.
11,024,371 B2 6/2021 Cui et al.
11,049,695 B2 6/2021 Kang et al.
2007/0042548 A1 2/2007 Noh et al.
2011/0024818 A1* 2/2011 Ahn ........................ H10D 30/69 257/314
2011/0303971 A1 12/2011 Lee et al.
2013/0009235 A1* 1/2013 Yoo ................... H01L 21/76294 257/E21.546
2014/0175530 A1 6/2014 Chien et al.
2014/0308789 A1 10/2014 Kai et al.
2015/0060979 A1* 3/2015 Lee ...................... H10D 64/512 257/314
2015/0079742 A1* 3/2015 Pachamuthu .......... H10B 41/20 438/268
2015/0123189 A1 5/2015 Sun et al.
2017/0069637 A1 3/2017 Son et al.
2017/0077131 A1 3/2017 Konagai et al.
2017/0278864 A1 9/2017 Hu et al.
2018/0019134 A1* 1/2018 Choi ...................... H10B 43/35
2018/0090307 A1 3/2018 Brunner et al.
2018/0144977 A1 5/2018 Yu et al.
2018/0233512 A1* 8/2018 Van Houdt ............ H10B 43/27
2018/0294187 A1* 10/2018 Thombare ......... H01L 21/76876
2018/0330985 A1 11/2018 Yu et al.
2019/0393042 A1 12/2019 Roy et al.
2020/0051994 A1 2/2020 Purayath et al.
2020/0091010 A1 3/2020 Li et al.
2020/0118822 A1 4/2020 Falk et al.
2020/0185408 A1 6/2020 Song et al.
2020/0203373 A1 6/2020 Kang et al.
2020/0266211 A1 8/2020 Tao et al.
2020/0312874 A1 10/2020 Kang et al.
2020/0350014 A1 11/2020 Liu
2020/0350287 A1 11/2020 Liu
2020/0402562 A1 12/2020 Li et al.
2020/0411509 A1 12/2020 Yang et al.
2021/0043643 A1 2/2021 Lu et al.
2021/0066460 A1 3/2021 Haller
2021/0126005 A1 4/2021 Lu et al.
2021/0210142 A1 7/2021 Liu
2021/0217773 A1 7/2021 Kang et al.
2021/0225865 A1 7/2021 Wu
2021/0233779 A1 7/2021 Kang et al.
2021/0233918 A1 7/2021 Koshizawa et al.
2021/0249436 A1 8/2021 Ding et al.
2021/0257375 A1 8/2021 Koshizawa et al.
2021/0257385 A1 8/2021 Hu et al.
2021/0257386 A1 8/2021 Wang et al.
2021/0257387 A1 8/2021 Huang et al.
2022/0051980 A1* 2/2022 Hopkins .............. H10D 30/693

FOREIGN PATENT DOCUMENTS

TW 202119123 A 5/2021
WO 2018195423 A1 10/2018

OTHER PUBLICATIONS

PCT International Search Report and Written Opinion in PCT/US2022/029114 dated Aug. 31, 2022, 11 pages.

* cited by examiner 100
120
118
119
114
112
110
108
104
103
106
104
102

100
128
119
118
124
119
126
114
112
110
108
104
103
106
104
102

100
128
119
118
124
119
126
114
112
110
108
104
130
104
102

POLY-SILICON BASED WORD LINE FOR 3D MEMORY

CROSS-REFERENCE TO RELATED APPLICATIONS

This application claims priority to U.S. Provisional Application No. 63/189,272, filed May 17, 2021, the entire disclosure of which is hereby incorporated by reference herein.

TECHNICAL FIELD

Embodiments of the present disclosure pertain to the field of electronic devices and methods and apparatus for manufacturing electronic devices. More particularly, embodiments of the disclosure provide methods for forming 3D-NAND memory cells.

BACKGROUND

Semiconductor technology has advanced at a rapid pace and device dimensions have shrunk with advancing technology to provide faster processing and storage per unit space. In NAND devices, the string current needs to be high enough to obtain sufficient current to differentiate ON and OFF cells. The string current is dependent on the carrier mobility which is enhanced by enlarging the grain size of the silicon channel.

Existing 3D-NAND memory stacks with alternating layers of oxide and nitride require replacement metal gate (RMG) processes to build word lines. Many commercial 3D NAND devices use charge trap (CT) as storage media where oxide/nitride (ON) mold is used. The nitride layer of the oxide/nitride mold is replaced by a word line metal, typically tungsten (W). This word line replacement process is a critically difficult process among 3D NAND processes.

One way to avoid a word line replacement process is using alternating layers of silicon (Si) and silicon germanium (SiGe), in which silicon remains as a word line, while SiGe is replaced with an insulator (e.g., silicon oxide (SiO)). One of the problems with the Si/SiGe mold is the high word line resistance compared to tungsten in the ON mold.

Accordingly, there is a need in the art for 3D-NAND devices having a silicon/silicon germanium mold with low word line resistance.

SUMMARY

One or more embodiments of the disclosure are directed to semiconductor devices, 3D NAND devices in particular. In one embodiment, a semiconductor device comprises: a memory stack on a common source line, the memory stack comprising alternating silicon oxide layers and word lines, the common source line comprising a slit region having a low resistivity material and the word lines comprising silicon and the low resistivity material; and a plurality of memory strings extending through the memory stack.

Additional embodiments of the disclosure are directed to methods of forming semiconductor devices. In one an embodiment, a method of forming an electronic device comprises: forming a plurality of memory hole channels through a memory stack, the memory stack on a common source line and comprising alternating layers of a silicon word line and a first sacrificial layer, the silicon word line having a first end; pattering at least one opening extending through the memory stack, exposing the common source line; replacing the first sacrificial layer with an oxide layer; and forming a low resistivity material on the exposed common source line and on the first end of the silicon word line.

Further embodiments of the disclosure are directed to processing tools. In one embodiment, a processing tool comprises: a central transfer station comprising a robot configured to move a wafer; a plurality of process stations, each process station connected to the central transfer station and providing a processing region separated from processing regions of adjacent process stations, the plurality of process stations comprising one or more of a pre-cleaning chamber, a silicidation chamber, a nitridation chamber, an Ohmic layer deposition chamber, a metal deposition chamber, and an annealing chamber; and a controller connected to the central transfer station and the plurality of process stations, the controller configured to activate the robot to move the wafer between process stations, and to control a process occurring in each of the process stations.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been descried in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

Existing 3D-NAND memory stacks with alternating layers of oxide and nitride require replacement metal gate (RMG) process to build word lines. Because the stack height is becoming thicker, high aspect ratio (HAR) memory hole etch/fill processes and stress control are becoming more difficult.

One or more embodiments advantageously provide a non-replacement metal gate (RMG) process that results in word lines having comparable resistance when compared to word lines made from oxide/nitride molds and replacement metal gate processes. In one or more embodiments, a portion of the poly-silicon word line comprises a low resistance material, e.g., a metal silicide, lowering the resistance of the word line when compared to a non-replacement silicon-based word line comprising tungsten (W). One or more embodiments provide a common source line (CSL) comprising a low resistance material, such that the common source line has a lower resistance without filling a conductor layer in the slits.

To control the surface between poly-silicon and the metal, metal deposition and other processes can be carried out in an isolated/integrated environment (e.g., a cluster process tool) without breaking vacuum. Accordingly, some embodiments of the disclosure provide integrated tool systems with related process modules to implement the methods.

Figure 1:
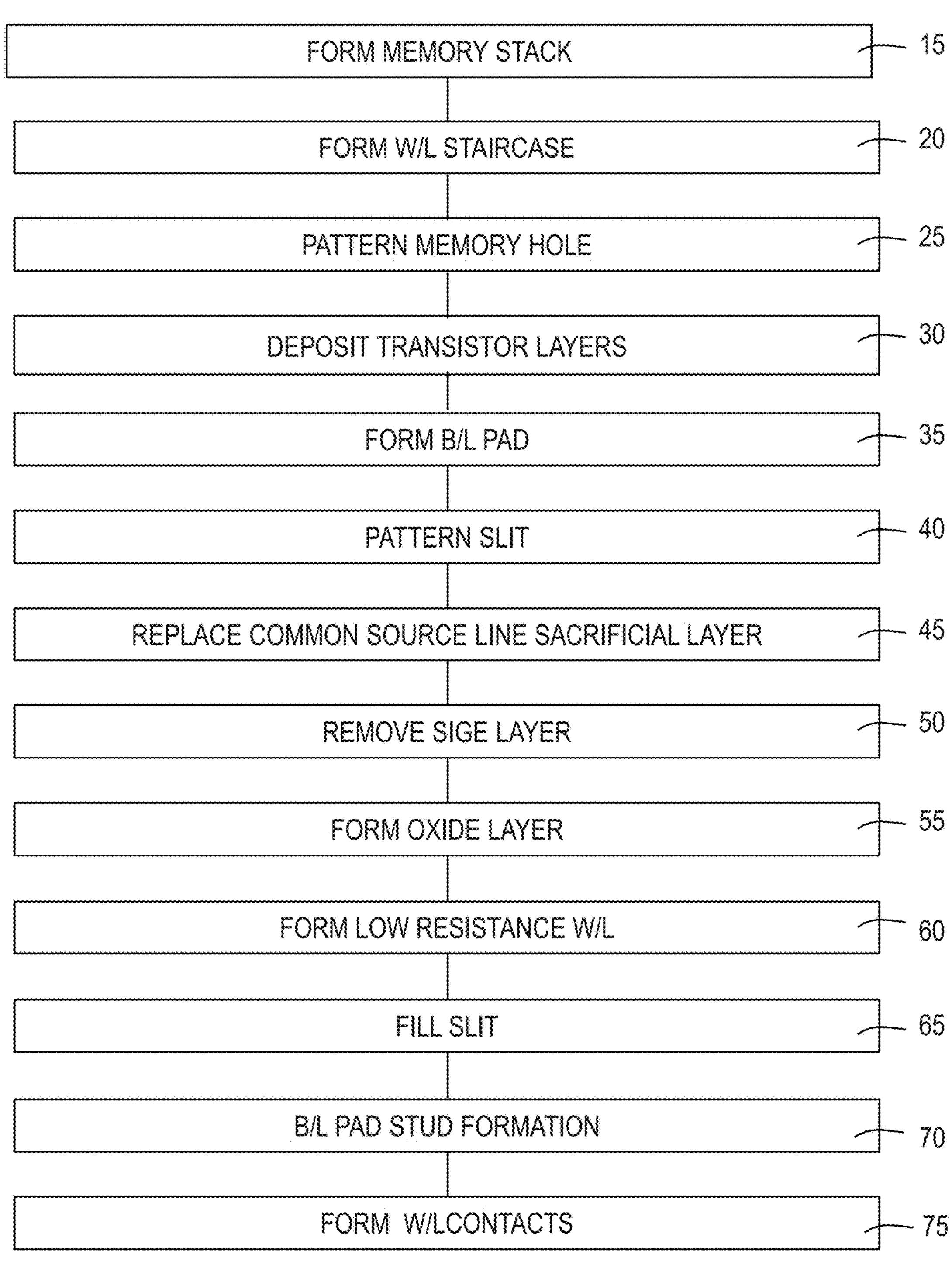
FIG. 1 illustrates a flow process diagram of one embodiment of a method of forming a memory device according to embodiments described herein.

FIG. 1 illustrates a process flow diagram for an exemplary method 10 for forming a memory device. The skilled artisan will recognize that the method 10 can include any or all of the processes illustrated. Additionally, the order of the individual processes can be varied for some portions. The method 10 can start at any of the enumerated processes without deviating from the disclosure. With reference to FIG. 1, at operation 15, a memory stack is formed. At operation 20, a word line staircase is formed in the memory stack. At operation 25, an opening, e.g., a memory hole channel, is patterned into the word line staircase. At operation 30, the transistor layers are deposited. At operation 35, the bitline pad is formed. At operation 40, the memory staircase is slit patterned. At operation 45, the sacrificial layer of the common source line is replaced. At operation 50, the sacrificial layer, e.g., silicon germanium, of the memory stack is removed. At operation 55, the opening formed by removing the sacrificial layer is filled with an oxide layer. At operation 60, a low resistance word line is formed. At operation 65, the slit is filled. At operation 70, the bitline contacts are formed. At operation 75, word line contacts are formed.

FIGS. 2-18 illustrate cross-section views of a portion of a memory device 100 following the process flow illustrated for the method 10 in FIG. 1. FIG. 19 illustrates a top-down view of a portion of a memory device 100 following the process flow illustrated for the method 10 of FIG. 1.

Figure 2:
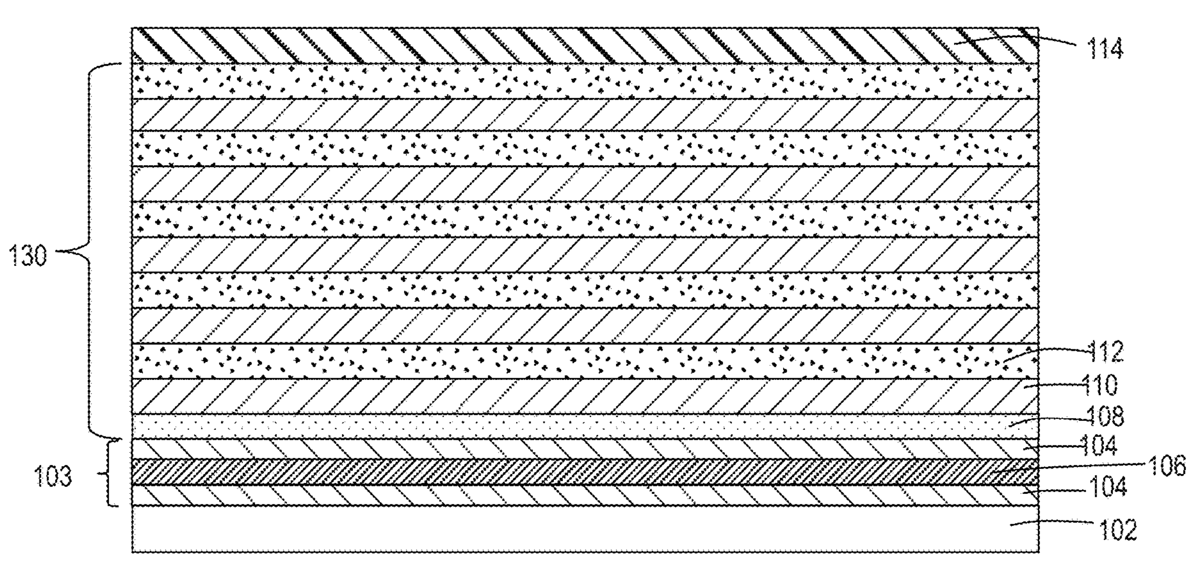
FIG. 2 illustrates a cross-sectional view of a device with a memory stack according to one or more embodiments.

FIG. 2 illustrates an initial or starting memory stack of an electronic device 100 in accordance with one or more embodiments of the disclosure. In some embodiments, the electronic device 100 shown in FIG. 2 is formed on the bare substrate 102 in layers, as illustrated. The electronic device of FIG. 2 is made up of a substrate 102, a common source line 103, and a memory stack 130.

The substrate 102 can be any suitable material known to the skilled artisan. As used in this specification and the appended claims, the term "substrate" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

In one or more embodiments, a common source line 103 is on the substrate 102. The common source line 103 may also be referred to as the semiconductor layers. The common source line 103 can be formed by any suitable technique known to the skilled artisan and can be made from any suitable material including, but not limited to, poly-silicon (poly-Si). In some embodiments, the common source line 103 comprises several different conductive or a semiconductor material. For example, in one or more embodiments, as illustrated in FIG. 2, the common source line 103 comprises a poly-silicon layer 104 on the substrate 102, a sacrificial layer 106 on the polysilicon layer, and a second polysilicon layer 104 on the sacrificial layer 106.

In one or more embodiments, a sacrificial layer 106 may formed on the polysilicon layer 104 and can be made of any suitable material. The sacrificial layer 106 in some embodiments is removed and replaced in later processes. In some embodiments, the sacrificial layer 106 is not removed and remains within the memory device 100. In this case, the term "sacrificial" has an expanded meaning to include permanent layers and may be referred to as the conductive layer. In the illustrated embodiment, as described further below, the sacrificial layer 106 is removed in operation 45. In one or more embodiments, the sacrificial layer 106 comprises a material that can be removed selectively versus the neighboring polysilicon layer 104. In one or more embodiments, the sacrificial layer comprises a nitride material, e.g., silicon nitride (SiN), or an oxide material, e.g., silicon oxide ($SiO_x$).

A memory stack 130 is formed on the sacrificial layer 120. The memory stack 130 in the illustrated embodiment comprises a plurality of alternating first material layers 110 and second material layers 112. While the memory stack 130, illustrated in FIG. 2, has five pairs of alternating first layers 108 and second layers 110, one of skill in the art recognizes that this is merely for illustrative purposes only. The memory stack 130 may have any number of alternating first layers 110 and second layers 112. For example, in some embodiments, the memory stack 130 comprises 192 pairs of alternating first layers 110 and second layers 112. In other embodiments, the memory stack 130 comprises greater than 50 pairs of alternating first layers 110 and second layers 112, or greater than 100 pairs of alternating first layers 110 and second layers 112, or greater than 300 pairs of alternating first layers 110 and second layers 112.

In one or more embodiments, the first material layers 110 and second material layers 112 may comprise any suitable material known to the skilled artisan. In one or more embodiments, the first material layers 110 comprise silicon (Si) and the second material layers 112 comprise silicon germanium (SiGe). In one or more embodiments, the silicon germanium comprises germanium in an amount in a range of from 1% to 100% on a molar basis. In one or more embodiments first material layers 110 and second material layers 112 are deposited by chemical vapor deposition (CVD) or physical vapor deposition (PVD).

The individual alternating layers may be formed to any suitable thickness. In some embodiments, the thickness of each second material layer 112 is approximately equal. In one or more embodiments, each second material layer 112 has a second material layer thickness. In some embodiments, the thickness of each first material layer 110 is approximately equal. As used in this regard, thicknesses which are approximately equal are within +/−5% of each other.

In one or more embodiments, the first material layers 110 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments the first material layer 110 has a thickness in the range of from about 0.5 to about 40 nm. In one or more embodiments, the second material layers 112 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments, the second material layer 112 has a thickness in the range of from about 0.5 to about 40 nm.

Figure 3:
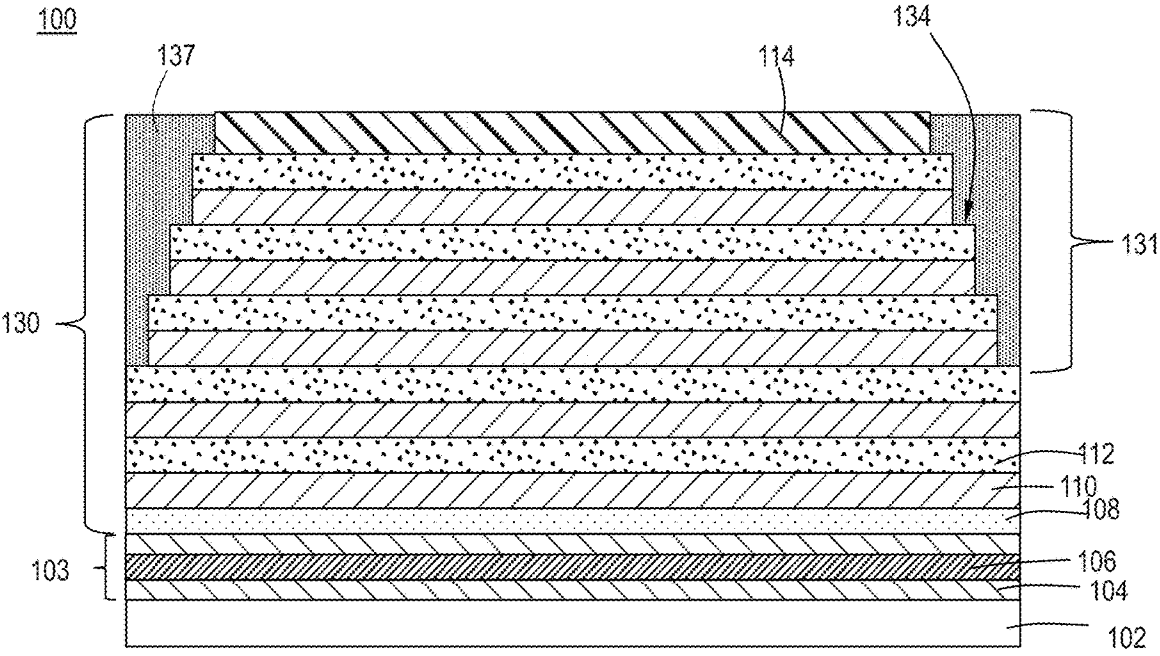
FIG. 3 illustrates a cross-sectional view of a substrate after forming a staircase pattern of the memory stack according to one or more embodiments.

Referring to FIG. 3, in one or more embodiments, at operation 20 of method 10, a staircase formation 131 is created. An oxide layer 114 is formed on a top surface of the memory stack 130. The oxide layer 114 can comprise any suitable oxide material known to the skilled artisan.

In one or more embodiments, the staircase formation 131 exposes a top surface 134 of the second material layers 112. The top surface 134 can be used to provide space for word line contacts to be formed, as described below. A suitable fill material 137 can be deposited to occupy the space outside the staircase formation 131. A suitable fill material 137, as will be understood by the skilled artisan, can be any material that prevents electrical shorting between adjacent word lines. A staircase formation 131 with each word line having a smaller width (illustrated from left-to-right in the figures) than the word line below. Use of relative terms like "above" and "below" should not be taken as limiting the scope of the disclosure to a physical orientation in space.

It is to be noted that for ease of illustration, the staircase formation 131 is not shown in FIGS. 4-20, but, as recognized by one of skill in the art, the staircase formation 131 is present.

Figures 4, 5A:
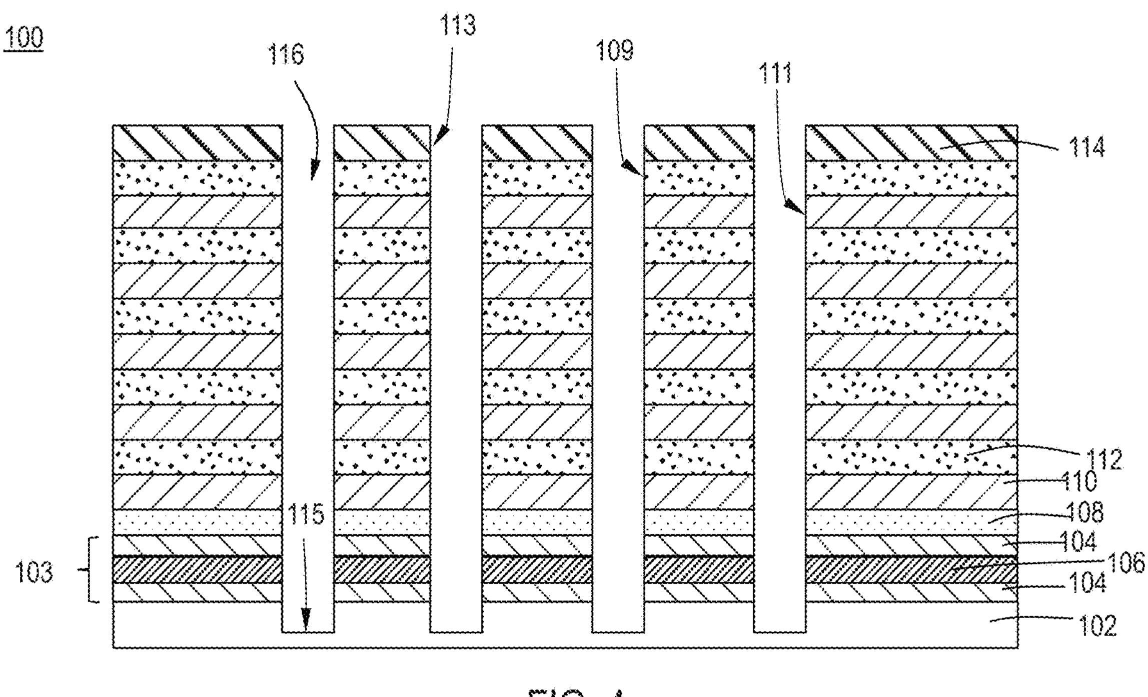
FIG. 4 illustrates a cross-sectional view of an electronic device according to one or more embodiments.
FIG. 5A illustrates a cross-sectional view of an electronic device according to one or more embodiments.
Figure 5B:
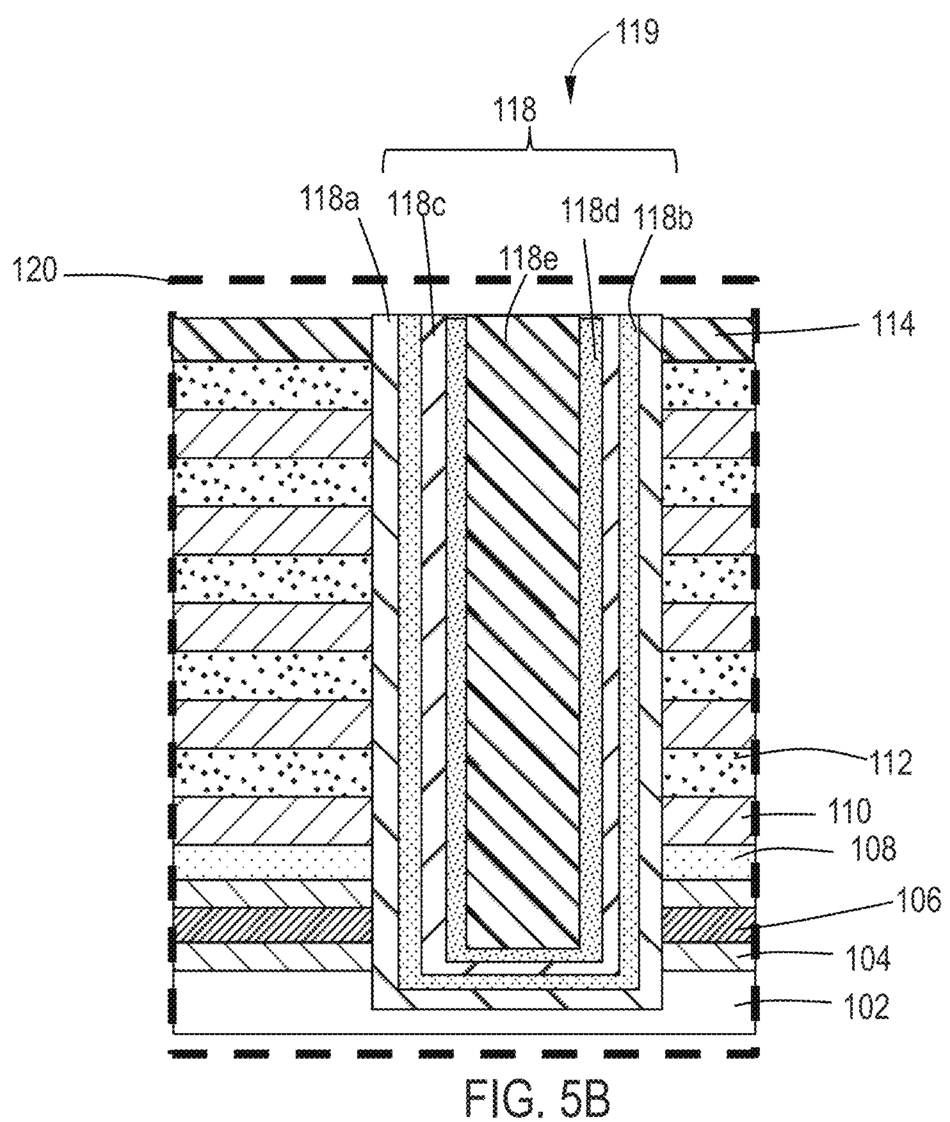
FIG. 5B illustrates an expanded view of region 120 of FIG. 5A according to one or more embodiments.

FIGS. 4-5B illustrate the formation of a memory string 119 through the memory stack 130. Referring to FIG. 4, at operation 25, in one or more embodiments, an opening 116 is opened through the memory stack 130. In some embodiments, the opening 116 comprises a memory hole channel. In some embodiments, forming the opening 116 comprises etching through the oxide layer 114, memory stack 130, common source line 103, and into substrate 102. The memory hole channel 116 has sidewalls that extend through the memory stack 130 exposing surfaces 111 of the first material layers 110 and surfaces 109 of the second material layers 112.

The oxide layer 114 has surfaces 113 exposed as sidewalls of the memory hole channel 116. The memory hole channel 116 extends a distance into the substrate 102 so that sidewall surfaces 109, 111, 113 and bottom 115 of the memory hole channel 116 are formed within the substrate 102. The bottom 115 of the memory hole channel 116 can be formed at any point within the thickness of the substrate 102. In some embodiments, the memory hole channel 116 extends a thickness into the substrate 102 in the range of from about 10% to about 90%, or in the range of from about 20% to about 80%, or in the range of from about 30% to about 70%, or in the range of from about 40% to about 60% of the thickness of the substrate 102. In some embodiments, the memory hole channel 116 extends a distance into the substrate 102 by greater than or equal to 10 nm. In some embodiments, the memory hole channel 116 extends from a top surface of the oxide layer 114 through the memory stack to a bottom surface of the substrate.

FIG. 5A shows operation 30 in which the transistor layers 118 are formed in the memory hole channel 116. The transistor layers 118 can be formed by any suitable technique known to the skilled artisan. In some embodiments, the transistor layers are formed by a conformal deposition process. In some embodiments, the transistor layers are formed by one or more of atomic layer deposition or chemical vapor deposition.

In one or more embodiments, the deposition of the transistor layers 118 is substantially conformal. As used herein, a layer which is "substantially conformal" refers to a layer where the thickness is about the same throughout (e.g., on the top, middle and bottom of sidewalls and on the bottom of the memory hole channel 116). A layer which is substantially conformal varies in thickness by less than or equal to about 5%, 2%, 1% or 0.5%. The transistor layers 118 in the memory hole channel may comprise one or more of a blocking oxide layer, a trap layer, a tunnel oxide layer, a channel layer, and a core oxide material.

Referring to FIG. 5B, which is an expanded view of region 120 of FIG. 5A, in one or more embodiments, the transistor layers 118 comprises a blocking oxide layer 118*a*, a nitride trap layer 118*b*, a tunnel oxide layer 118*c*, a channel material 118*d*, and a core oxide material 118*e* (or a core oxide layer 118*e*) in the memory hole channel 116. In one or more embodiments, the channel material 118*d* comprises poly-silicon.

The transistor layers 118 can have any suitable thickness depending on, for example, the dimensions of the memory hole channel 116. In some embodiments, the transistor layers 118 have a thickness in the range of from about 0.5 nm to about 50 nm, or in the range of from about 0.75 nm to about 35 nm, or in the range of from about 1 nm to about 20 nm.

Figures 6A, 6B:
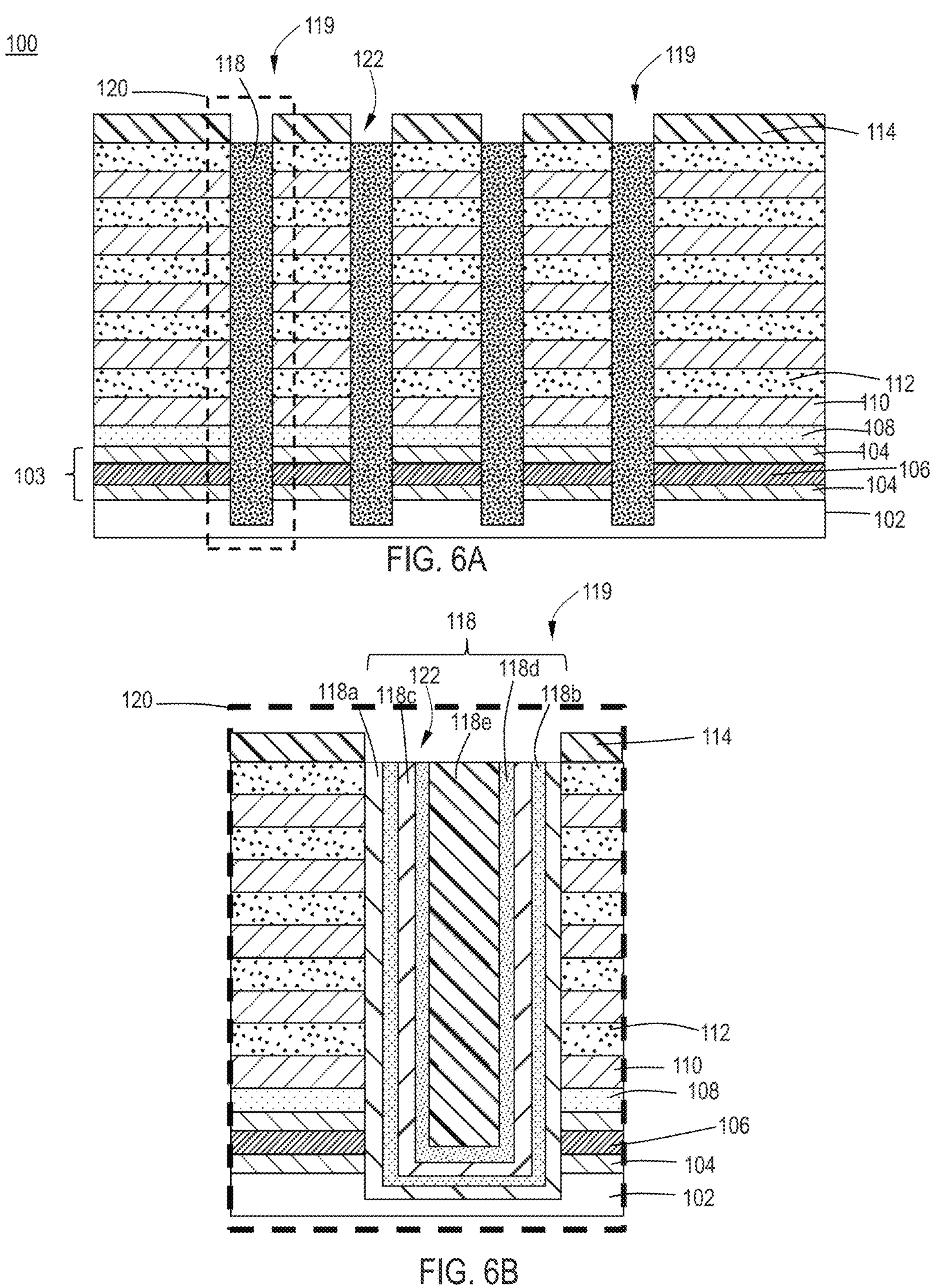
FIG. 6A illustrates a cross-sectional view of an electronic device according to one or more embodiments.
FIG. 6B illustrates an expanded view of region 120 of FIG. 6A according to one or more embodiments.
Figures 7A, 7B:
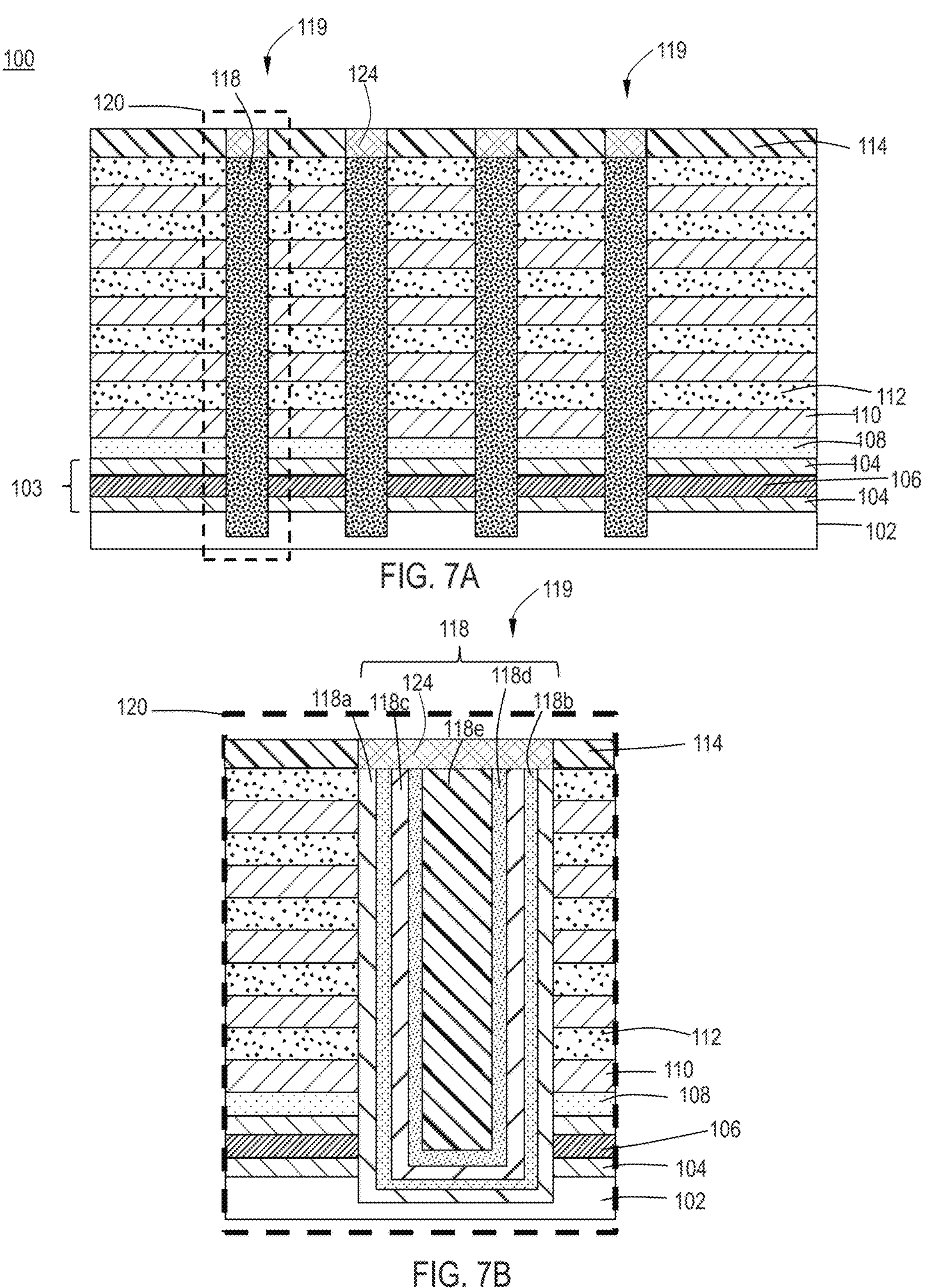
FIG. 7A illustrates a cross-sectional view of an electronic device according to one or more embodiments.
FIG. 7B illustrates an expanded view of region 120 of FIG. 7A according to one or more embodiments.

FIGS. 6A-7B show operation 35 of method 10 where a bitline pad 124 is formed on the top surface of the transistor layers 118 and in the oxide layer 114. The bitline pad 124 can be any suitable material known to the skilled artisan including, but not limited to, poly-silicon. Referring to FIGS. 6A and 6B, the transistor layers 118 are etched back to form a recess 122. As illustrated in FIGS. 7A and 7B, the recess 122 is then filled with a bitline pad 124.

Figures 8, 9:
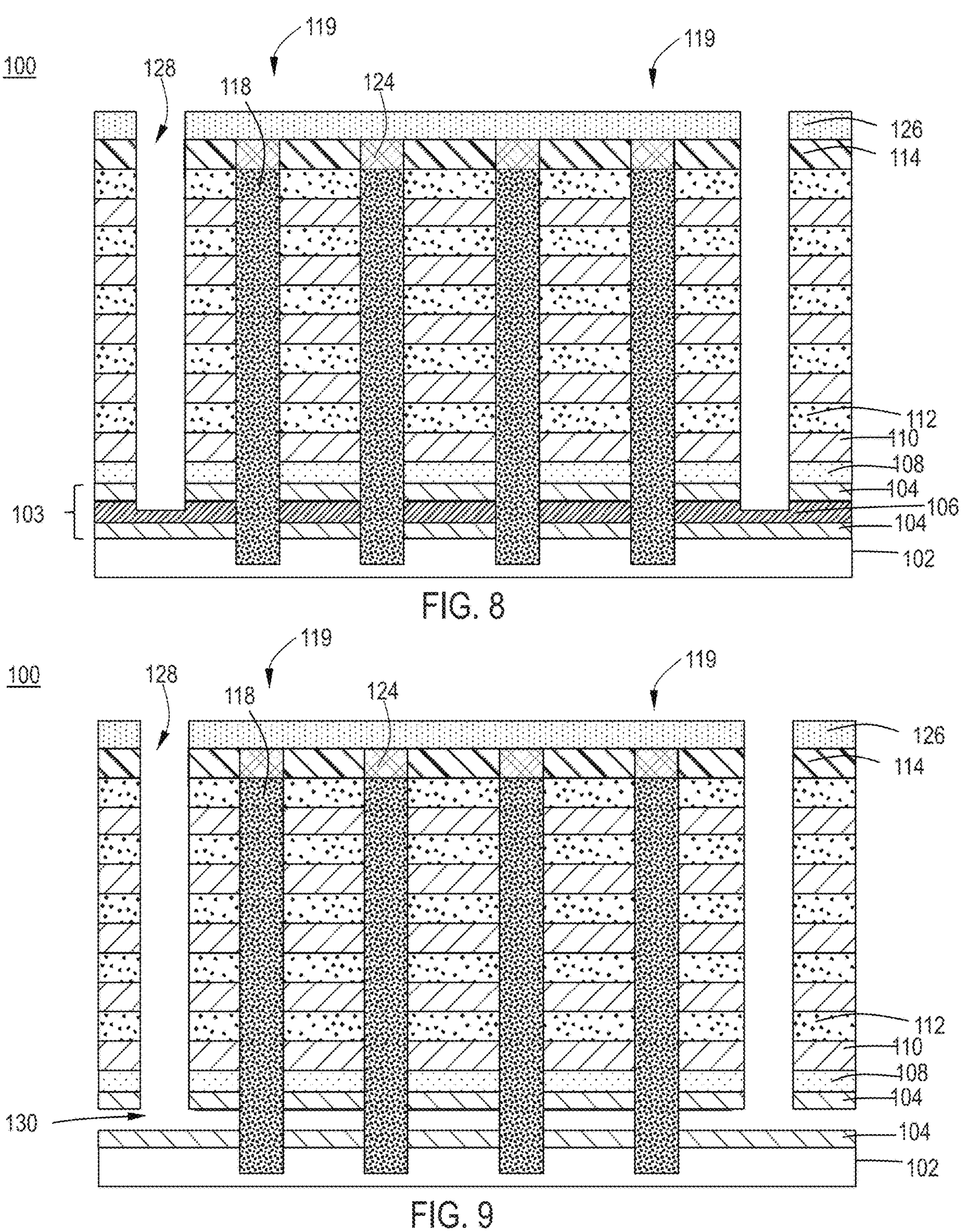
FIG. 8 illustrates a cross-sectional view of an electronic device according to one or more embodiments.
FIG. 9 illustrates a cross-sectional view of an electronic device according to one or more embodiments.

Referring to FIG. 8, at operation 40 of method 10, the memory stack 130 is slit patterned to form slit pattern openings 128 that extend from a top surface of the oxide layer 114 to the sacrificial layer 106 of the common source line 103.

Referring to FIGS. 9-11B, at operation 45 of method 10, the sacrificial layer 106 in the common source line 103 is removed to form opening 130. The sacrificial layer 106 can be removed by any suitable technique known to the skilled artisan including, but not limited to, selective etching, hot phosphoric acid, and the like.

Figures 10A, 10B:
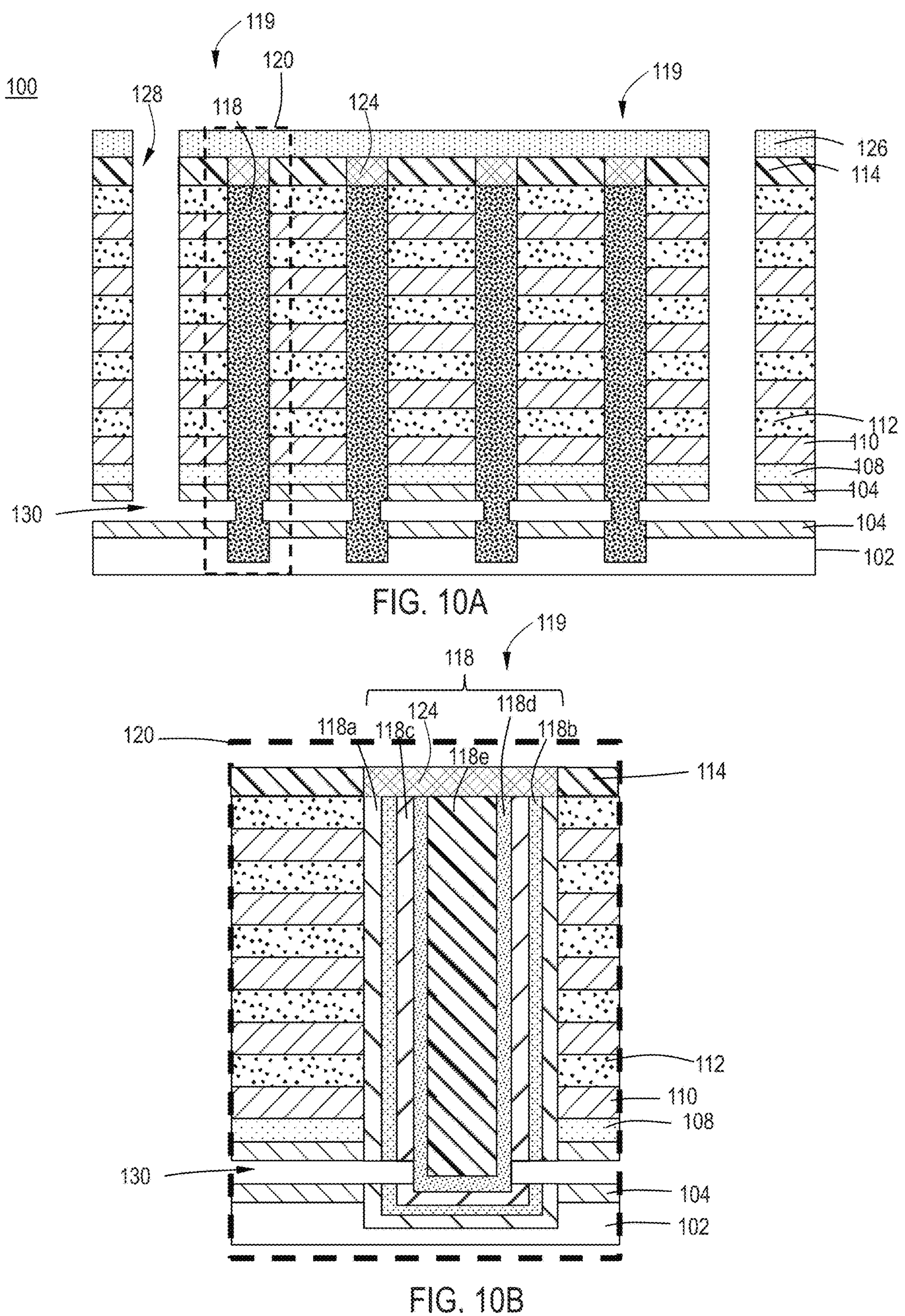
FIG. 10A illustrates a cross-sectional view of an electronic device according to one or more embodiments.
FIG. 10B illustrates an expanded view of region 120 of FIG. 10A according to one or more embodiments.
Figures 11A, 11B:
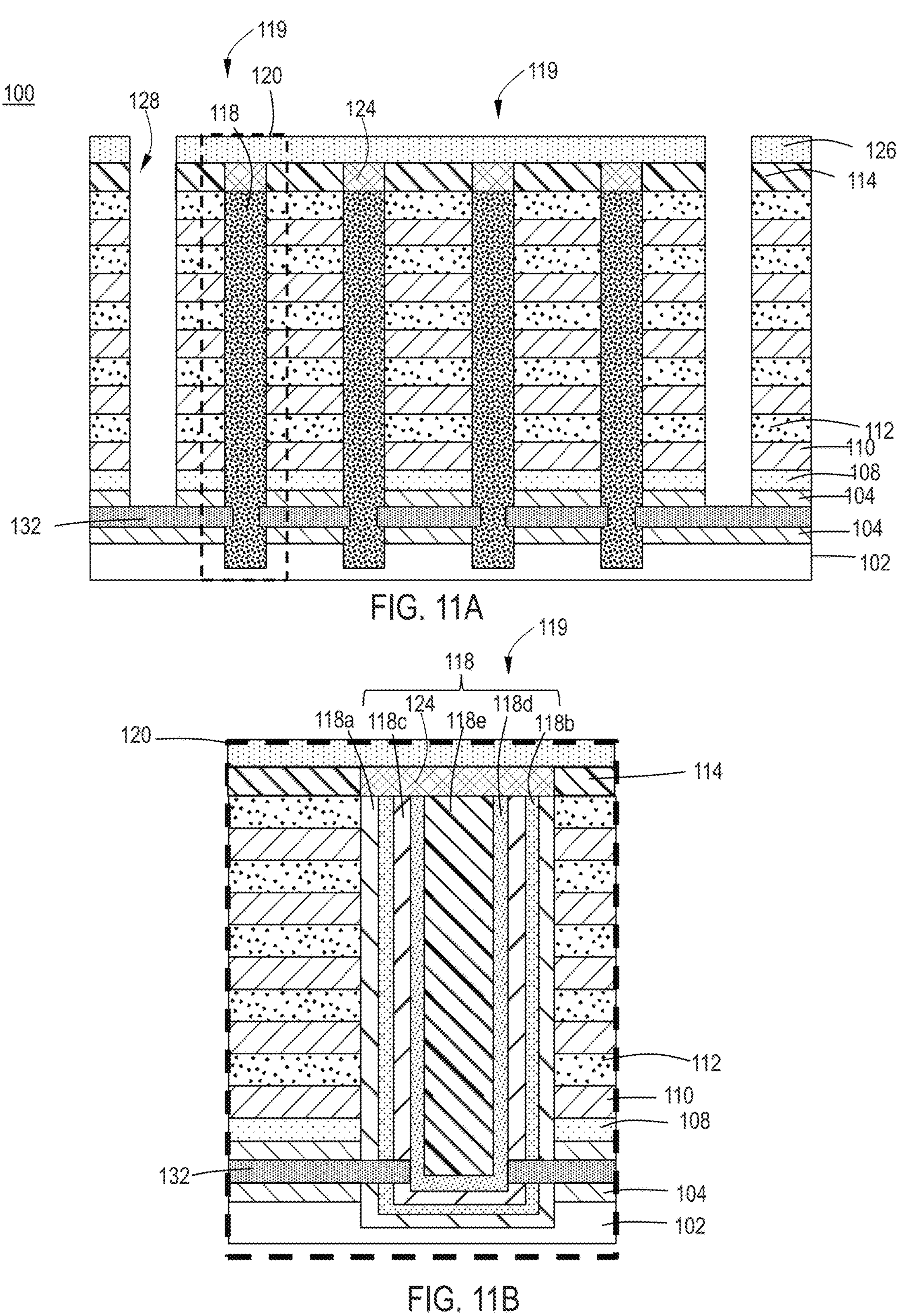
FIG. 11A illustrates a cross-sectional view of an electronic device according to one or more embodiments.
FIG. 11B illustrates an expanded view of region 120 of FIG. 11A according to one or more embodiments.

With reference to FIGS. 10A and 10B, the blocking oxide layer 118*a*, the nitride trap layer 118*b*, and the tunnel oxide layer 118*c* are removed through opening 130 to expose the channel layer 118*d* in the common source line region. The blocking oxide layer 118*a*, the nitride trap layer 118*b*, and the tunnel oxide layer 118*c* may be removed by any suitable means known to the skilled artisan. In one or more embodiments, the blocking oxide layer 118*a*, the nitride trap layer 118*b*, and the tunnel oxide layer 118*c* are removed using hydrogen fluoride (HF) and phosphoric acid ($H_3PO_4$) etching. Referring to FIGS. 11A and 11B, the opening 130 is filled with a poly-silicon layer 132. The poly-silicon layer 132 may be doped or undoped. In some embodiments, the poly-silicon layer 132 is an n-doped poly-silicon layer.

Figure 12:
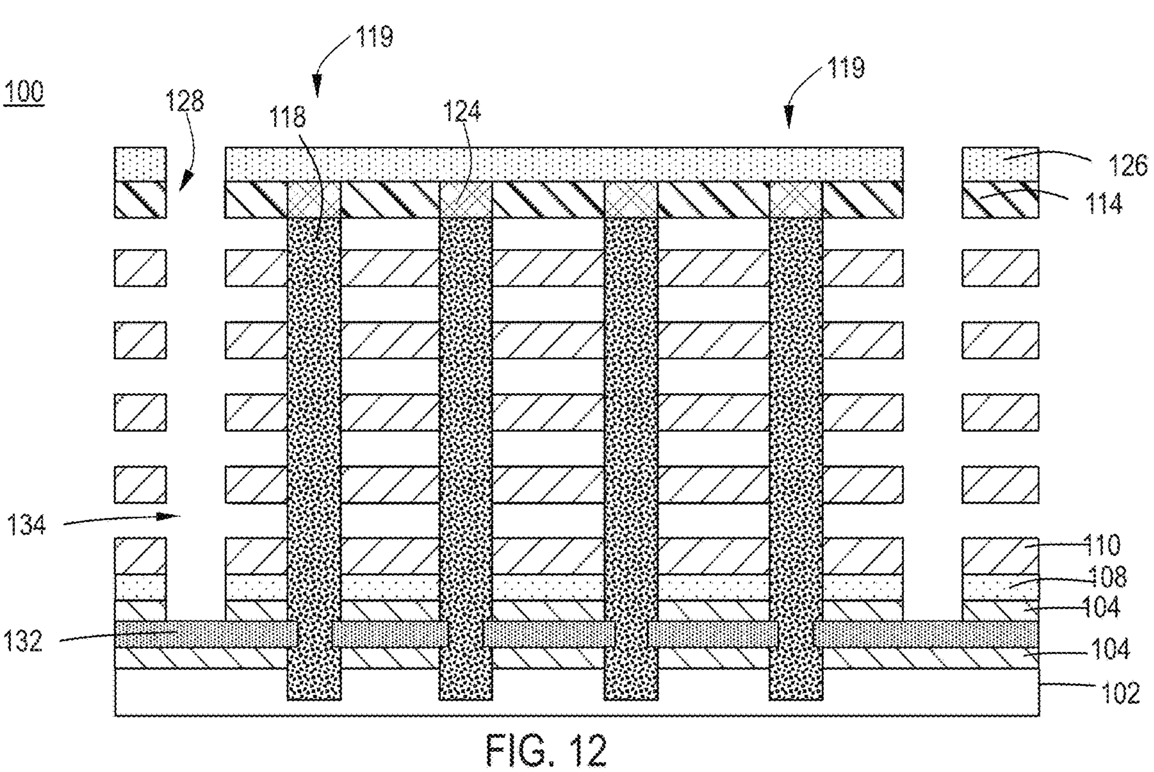
FIG. 12 illustrates a cross-sectional view of an electronic device according to one or more embodiments.

FIG. 12 illustrates operation 50 where the second material layers 112, e.g., silicon germanium, are removed. The second material layers 112 may be removed by any suitable means known to the skilled artisan. In one or more embodiments, the second material layers 112 are removed by selective etching, e.g., selective wet etching or selective dry etching. Removal of the second material layers 112 forms opening 134.

Figure 13A:
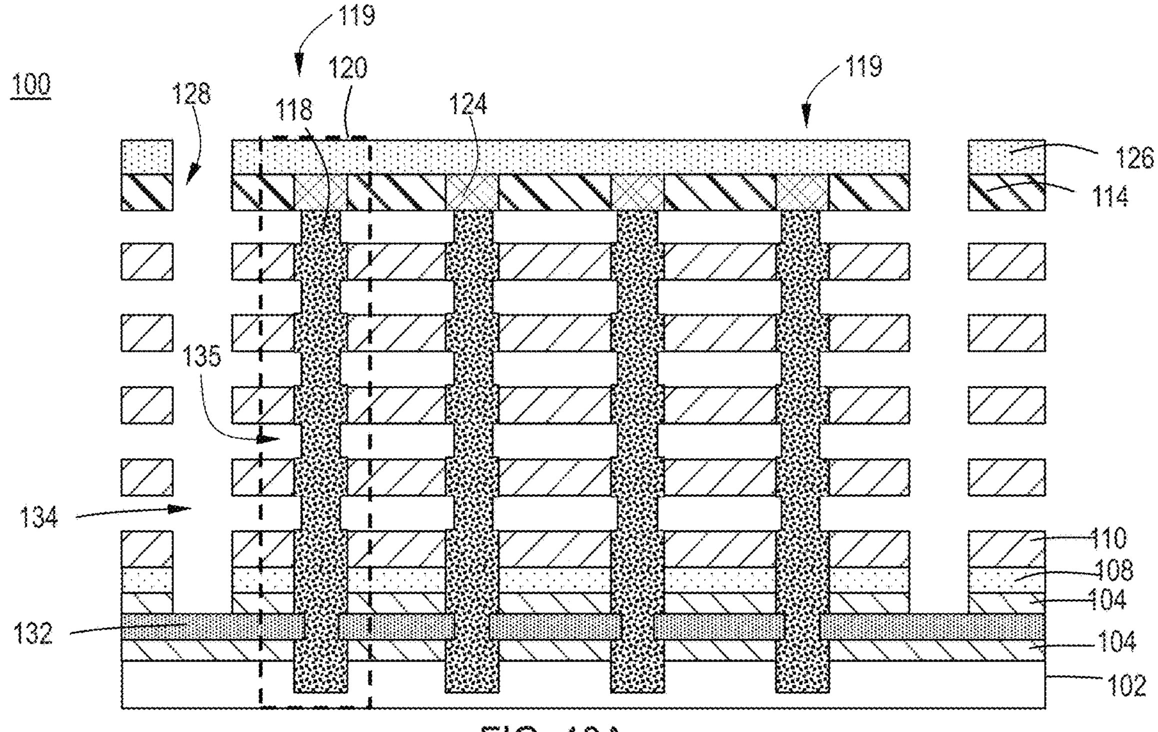
FIG. 13A illustrates a cross-sectional view of an electronic device according to one or more embodiments.
Figures 13B, 14A:
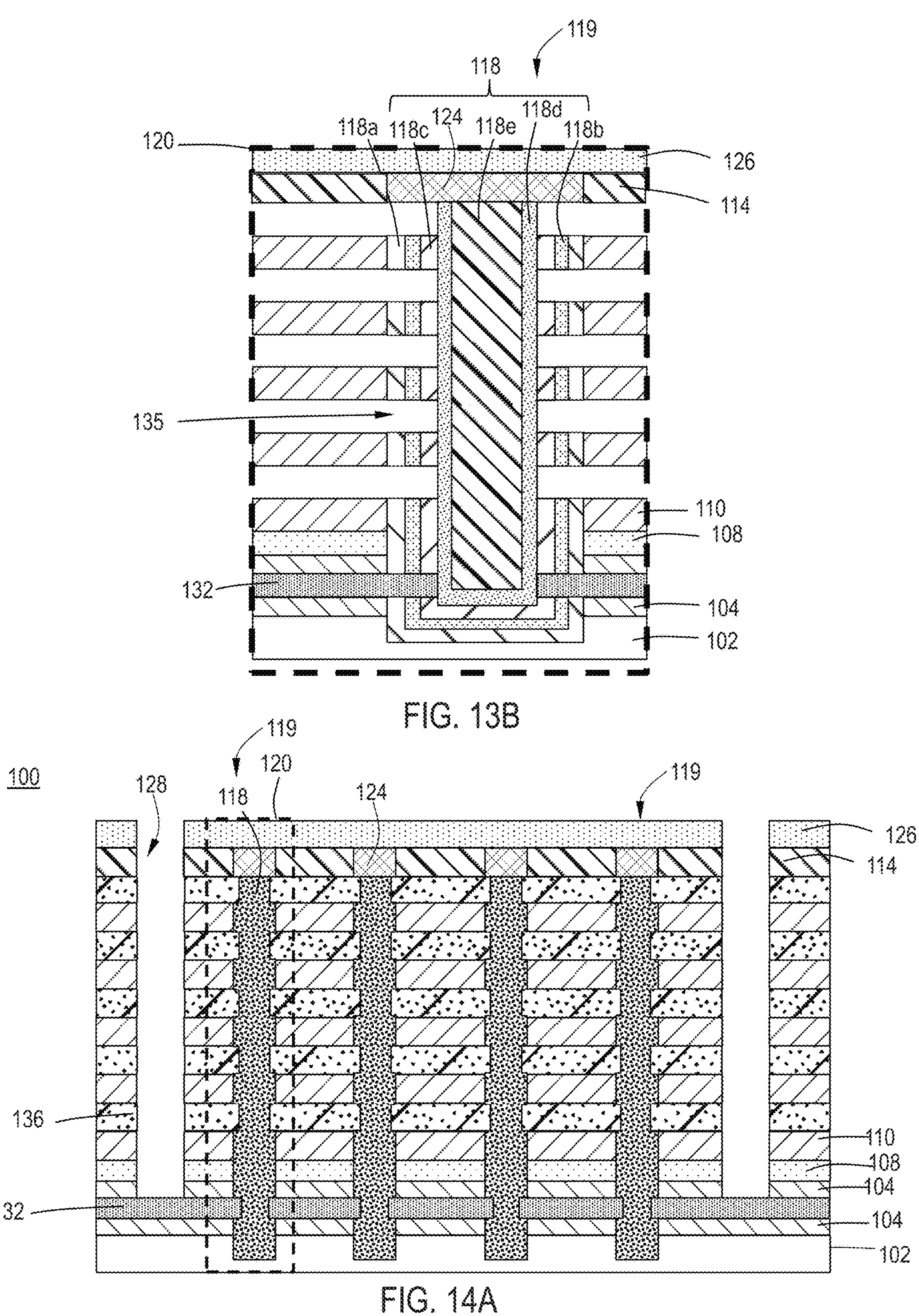
FIG. 13B illustrates an expanded view of region 120 of FIG. 13A according to one or more embodiments.
FIG. 14A illustrates a cross-sectional view of an electronic device according to one or more embodiments.

With reference to FIGS. 13A and 13B, the blocking oxide layer 118*a*, the nitride trap layer 118*b*, and the tunnel oxide layer 118*c* are removed through opening 134 to expose the channel layer 118*d* in the region 135. The blocking oxide layer 118*a*, the nitride trap layer 118*b*, and the tunnel oxide layer 118*c* may be removed by any suitable means known to the skilled artisan. In one or more embodiments, the blocking oxide layer 118*a*, the nitride trap layer 118*b*, and the tunnel oxide layer 118*c* are removed using hydrogen fluoride (HF) and phosphoric acid ($H_3PO_4$) etching.

Figure 14B:
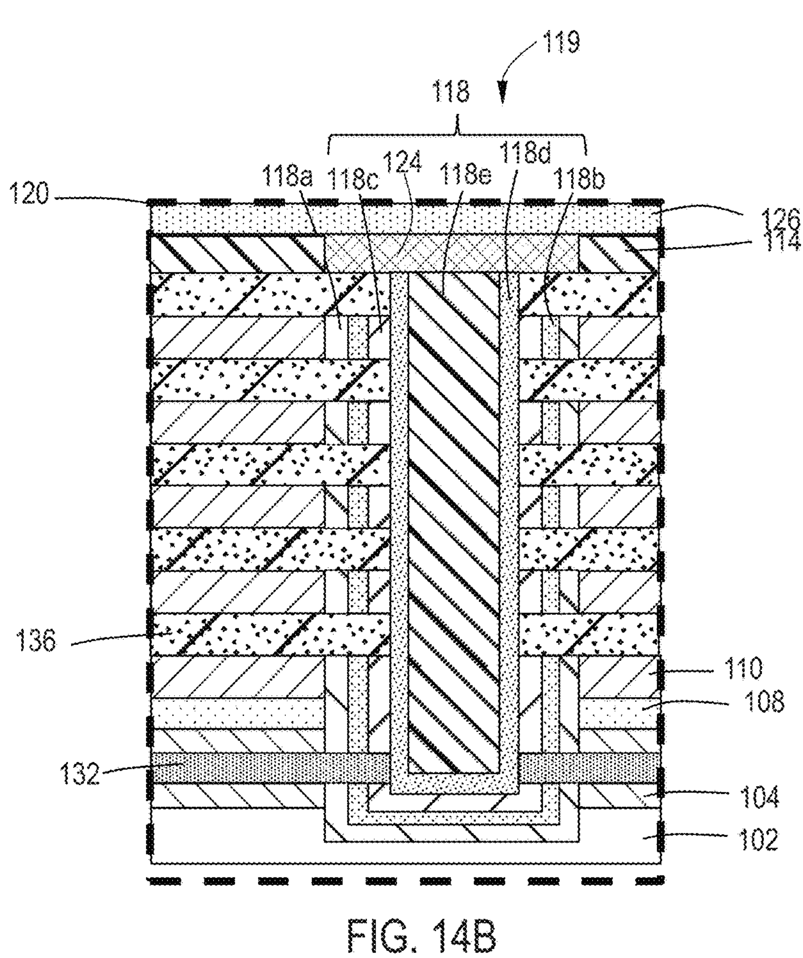
FIG. 14B illustrates an expanded view of region 120 of FIG. 14A according to one or more embodiments.

Referring to FIGS. 14A and 14B, at operation 55, an oxide layer 136 is conformally deposited in opening/region 135. The oxide layer 136 may comprise any suitable oxide material known to the skilled artisan. In one or more embodiments, the oxide layer 136 comprises silicon oxide. While the term "silicon oxide" may be used to describe the oxide layer 136, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. The same is true for the other materials listed in this disclosure, e.g., silicon nitride, silicon oxynitride, aluminum oxide, zirconium oxide, and the like.

Figure 15A:
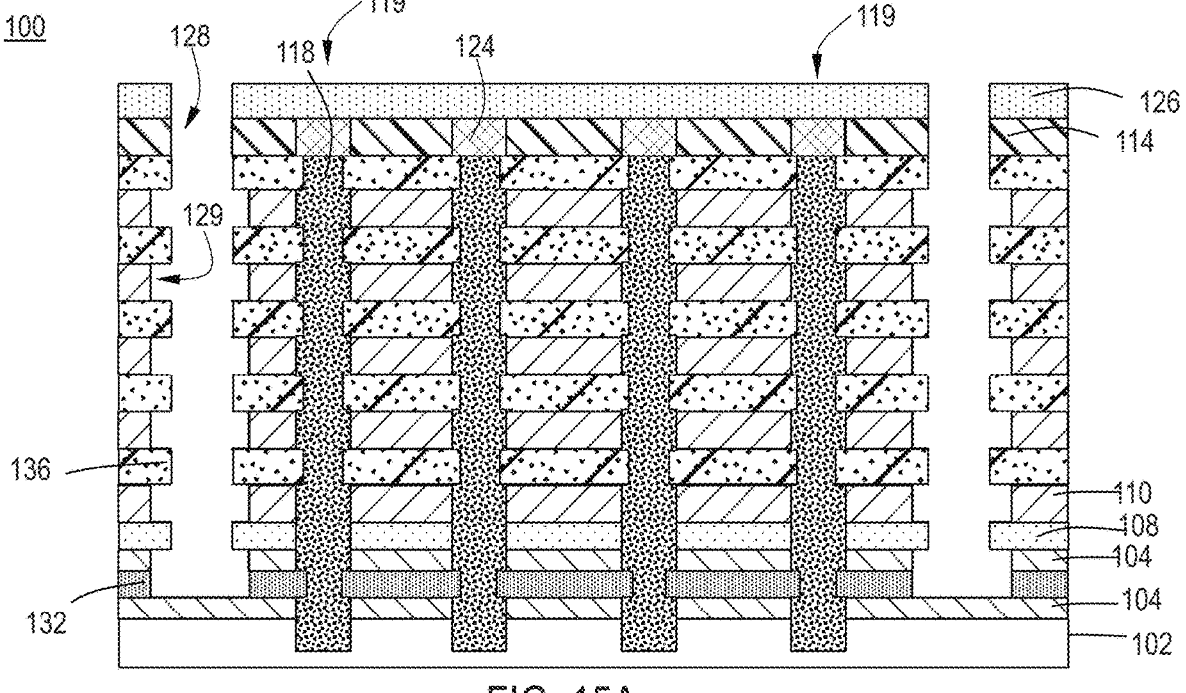
FIG. 15A illustrates a cross-sectional view of an electronic device according to one or more alternative embodiments.
Figure 15B:
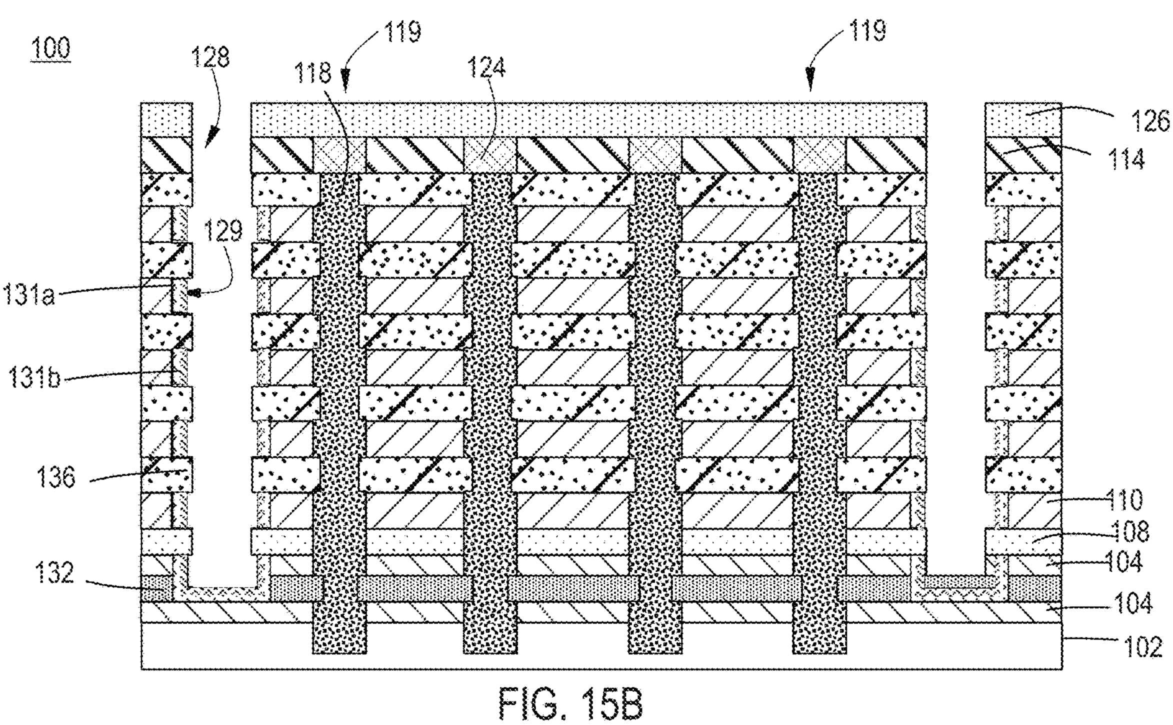
FIG. 15B illustrates a cross-sectional view of an electronic device according to one or more alternative embodiments.
Figure 15C:
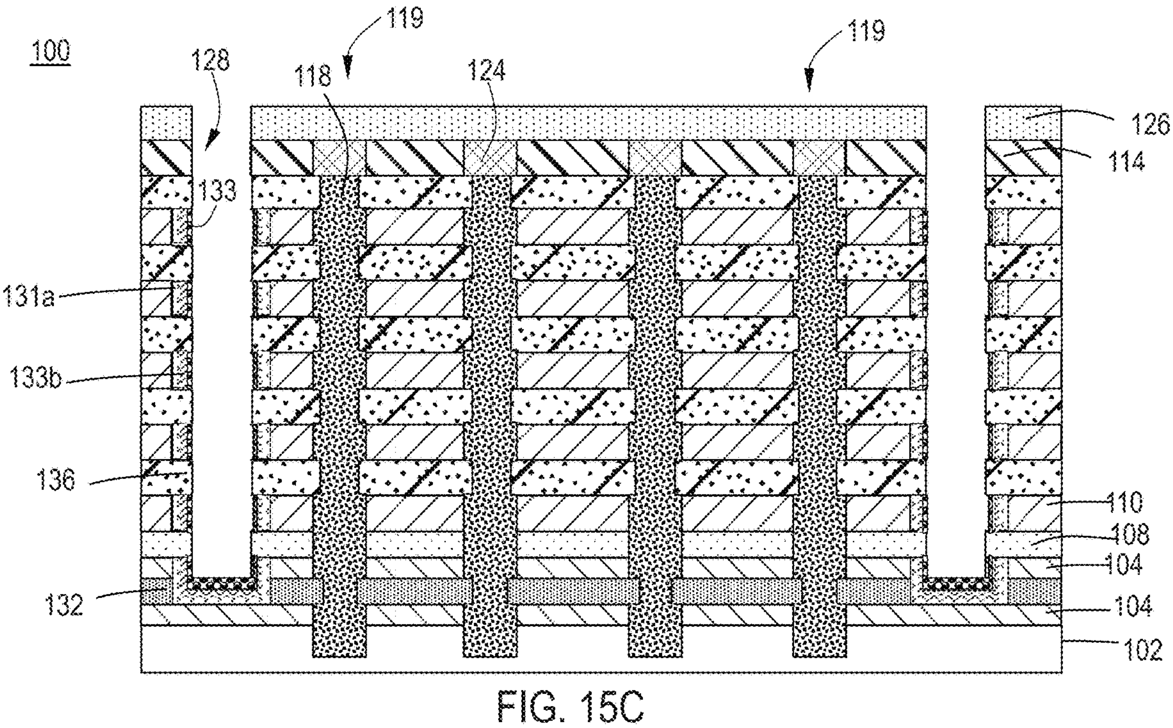
FIG. 15C illustrates a cross-sectional view of an electronic device according to one or more alternative embodiments.

At operation 60, a low resistance word line is advantageously formed. In one or more embodiments, it may be advantageous for the word line to comprise low resistivity materials. In some embodiments, the low resistivity material has a resistivity in a range of from 5 μΩcm to 100 μΩcm. In some embodiments, as illustrated in FIGS. 15A-15C, low resistivity materials, e.g., low resistivity material 133, may be formed by recessing the word line and selectively growing the low resistivity materials in the recessed portion of the word line. In other embodiments, as illustrated in FIGS.

18A-18C, low resistivity materials, e.g., silicidated metal layer 142, may be formed by depositing a metal layer and silicidating the metal in the word line region and in the common source line region.

Referring to FIGS. 15A, the word line first material layer 110 and the oxide layer 104 and the common source line 132 are recessed to form a recessed region 129.

With reference to FIG. 15B, the device 100 is pre-cleaned using any suitable means known to the skilled artisan, including, but not limited to SiCoNi® cleaning. In one or more embodiments, an Ohmic layer 131*a* is deposited in slit 128 into the recessed region 129. The Ohmic layer 131*a* may be deposited by any suitable means known to the skilled artisan. In one or more embodiments, the Ohmic layer 131*a* is deposited by selective atomic layer deposition (ALD). The Ohmic layer 131*a* may comprise any suitable material known to the skilled artisan. In one or more embodiments, the Ohmic layer 131*a* comprises titanium (Ti). The Ohmic layer 131*a* may have any suitable thickness. For example, in one or more embodiments, the Ohmic layer 131*a* has a thickness in a range of from 1 nm to 10 nm. In some embodiments, the Ohmic layer 131*a* is nitridated to form a nitridated Ohmic layer 131*b*. In one or more embodiments, when the Ohmic layer 131*a* comprises titanium and is then nitridated, the nitridated Ohmic layer 131*b* comprises titanium nitride (TiN).

Referring to FIG. 15C, a low resistivity material 133 is conformally deposited in slit 128 into the recessed region 129 and onto the nitride Ohmic layer 131*b*. The low resistivity material 133 may comprise any suitable material known to the skilled artisan. In one or more embodiments, the low resistivity material 133 comprises one or more of tungsten (W), ruthenium (Ru), iridium (Ir), tantalum (Ta), titanium (Ti), platinum (Pt), molybdenum (Mo), and nickel (Ni). The low resistivity material 133 has a thickness in a range of from 5 nm to 150 nm.

Figure 16:
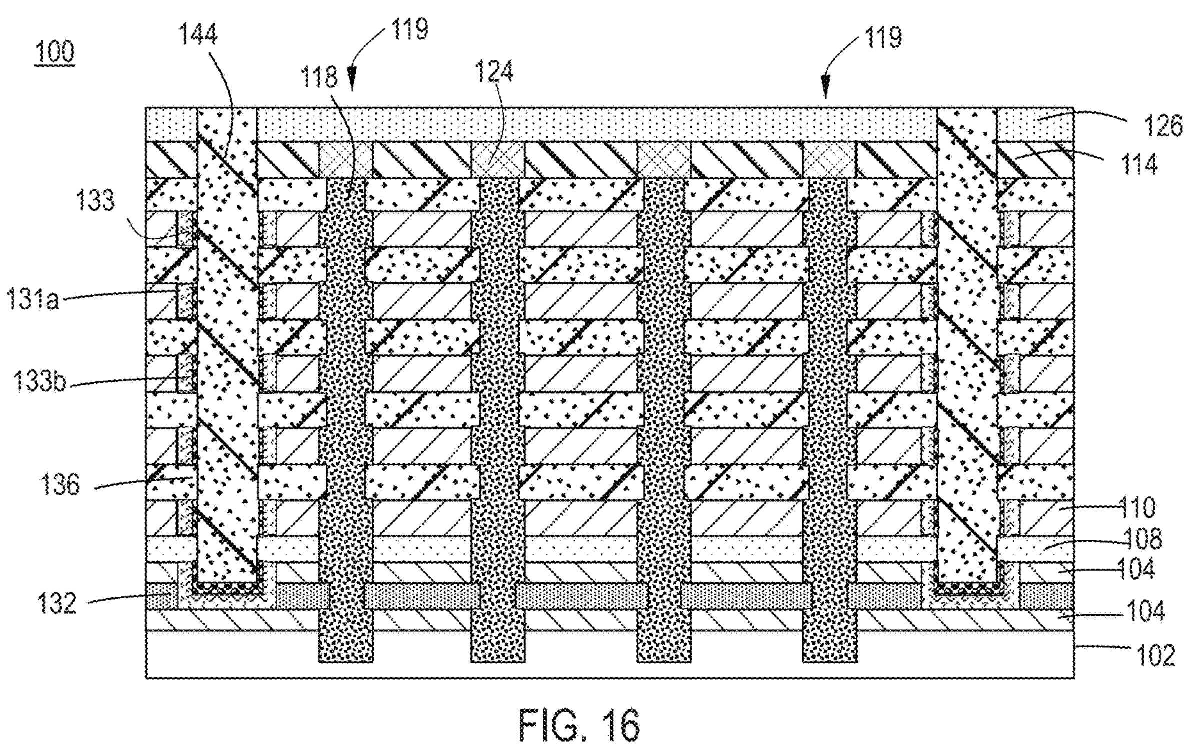
FIG. 16 illustrates a cross-sectional view of an electronic device according to one or more embodiments.

FIG. 16 shows operation 65 of method 10, where the slit 128 is filled with an insulator material 144. The insulator material 144 may be any suitable material known to the skilled artisan. In one or more embodiments, the filled slit 128 comprises an insulator material 144 selected from one or more of silicon oxide, silicon nitride, and silicon oxynitride. In one or more embodiments, the insulator material 144 is silicon oxide.

Figure 17:
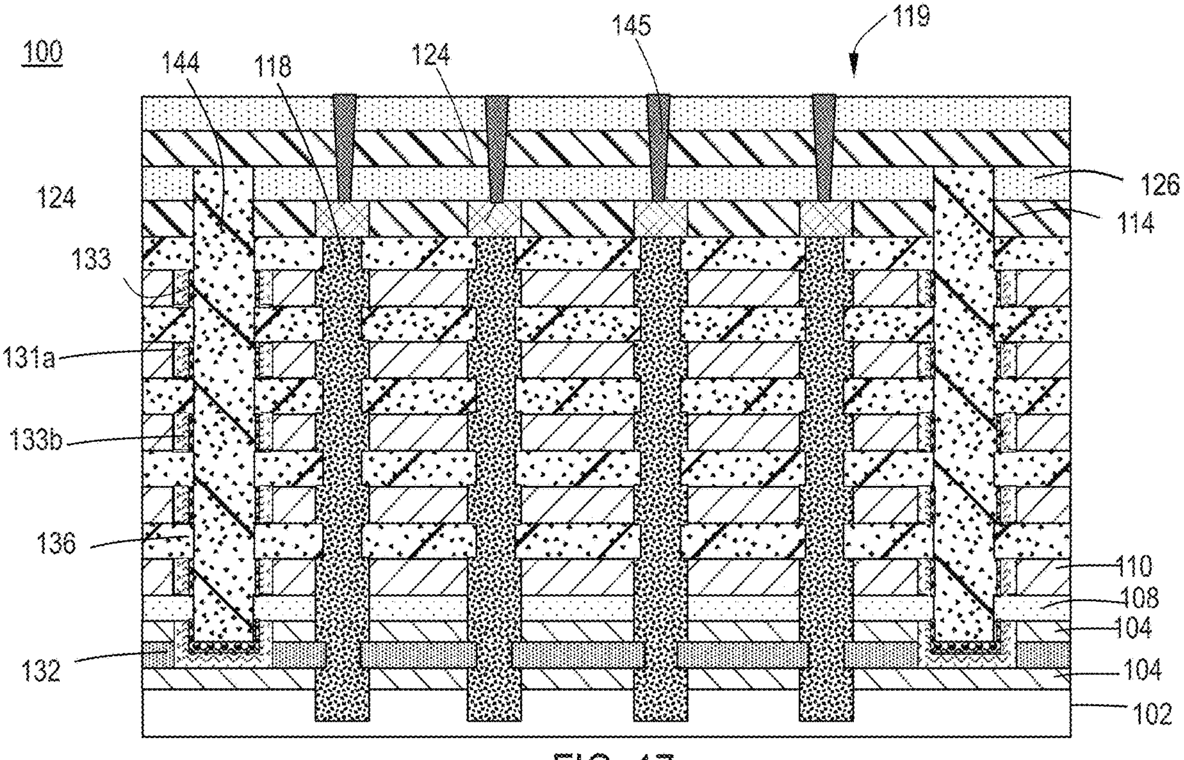
FIG. 17 illustrates a cross-sectional view of an electronic device according to one or more embodiments.
Figure 18A:
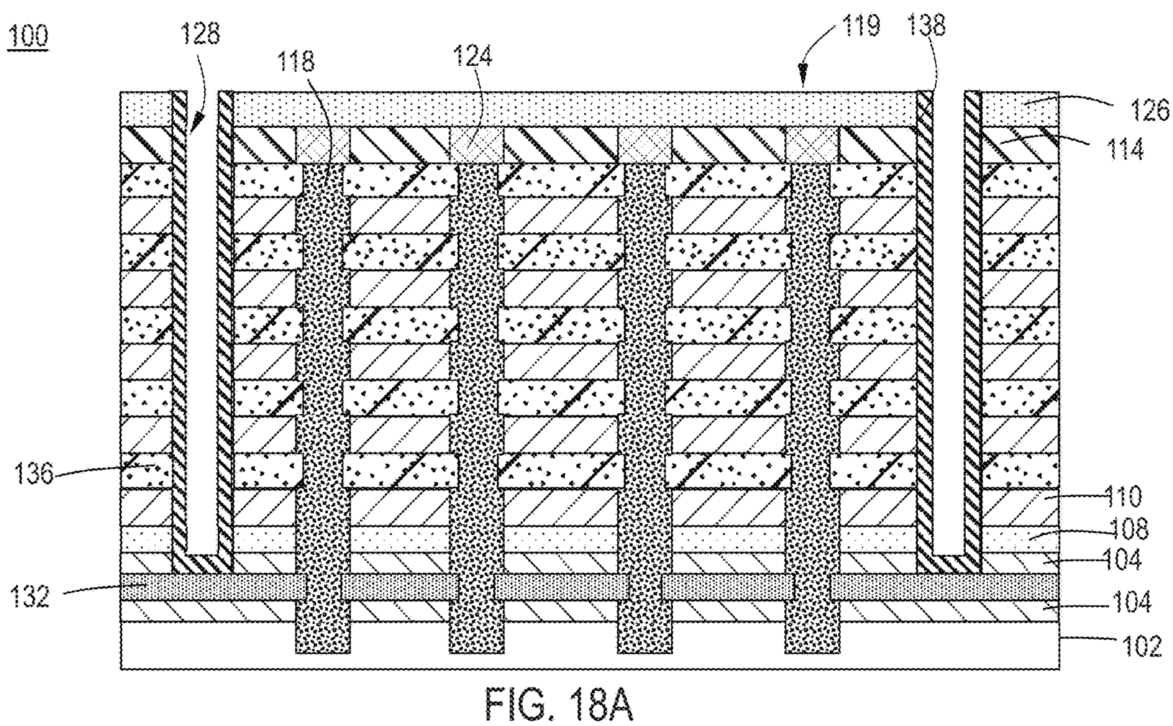
FIG. 18A illustrates a cross-sectional view of an electronic device according to one or more embodiments.

FIG. 17 shows operation 70 of method 10, wherein bitline pad studs 145 are formed. The bitline studs 145 may be formed by any suitable means known to the skilled artisan.

In other embodiments, low resistivity materials may be formed by depositing a metal layer and silicidating the metal layer in the word line region and in the common source line region. Referring to FIG. 18A, a metal layer 140 is conformally deposited in slit 128. The metal layer 140 may comprise any suitable metal known to the skilled artisan. In one or more embodiments, the metal layer 140 comprises a metal selected from the group consisting of cobalt (Co), nickel (Ni), molybdenum (Mo), titanium (Ti), platinum (Pt), tantalum (Ta), and ruthenium (Ru).

The metal layer 140 may be deposited by any suitable means known to the skilled artisan. The metal layer 140 may have any suitable thickness. In one or more embodiments, the metal layer 140 has a thickness in a range of from 5 nm to 150 nm, or in a range of from 10 nm to 35 nm.

Figure 18B:
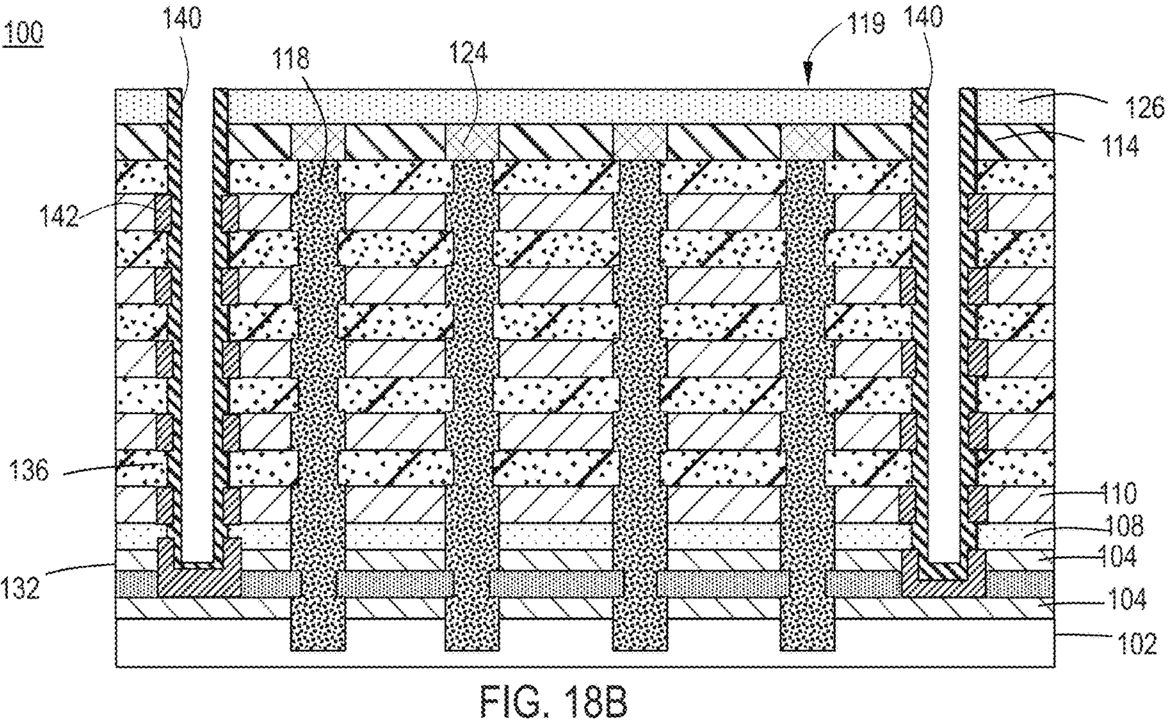
FIG. 18B illustrates a cross-sectional view of an electronic device according to one or more embodiments.
Figure 19:
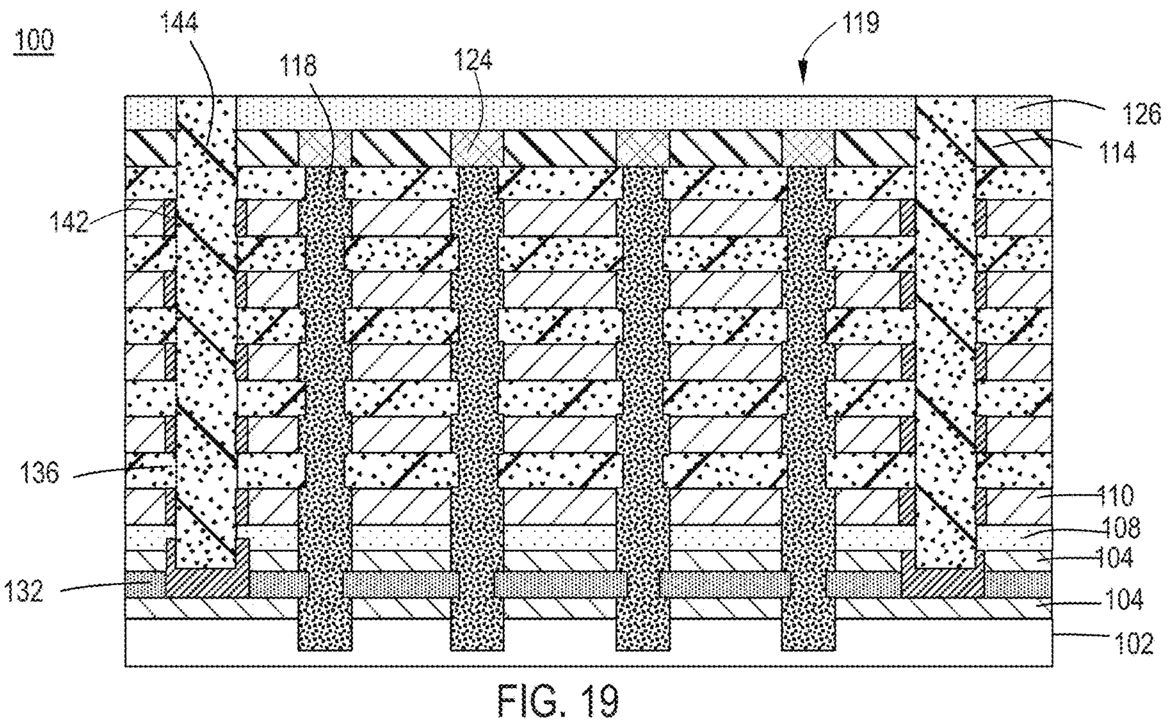
FIG. 19 illustrates a cross-sectional view of an electronic device according to one or more embodiments.

Referring to FIG. 18B, the metal layer 140 is annealed to form a silicidated metal layer 142. Annealing may be any suitable annealing process known to the skilled artisan. In one or more embodiments, the metal layer 140 is annealed at a temperature in a range of from 600° C. to 800° C. in an inert atmosphere, e.g., nitrogen ($N_2$), for a duration of 1 second to 60 seconds. In one or more embodiments, the silicidated metal layer 142 comprises a metal silicide. The metal silicide may be selected from one or more of cobalt silicide (CoSi), nickel silicide (NiSi), molybdenum silicide (MoSi), titanium silicide (TiSi), platinum silicide (PtSi), tantalum silicide (TaSi), and ruthenium silicide (RuSi).

Figure 18C:
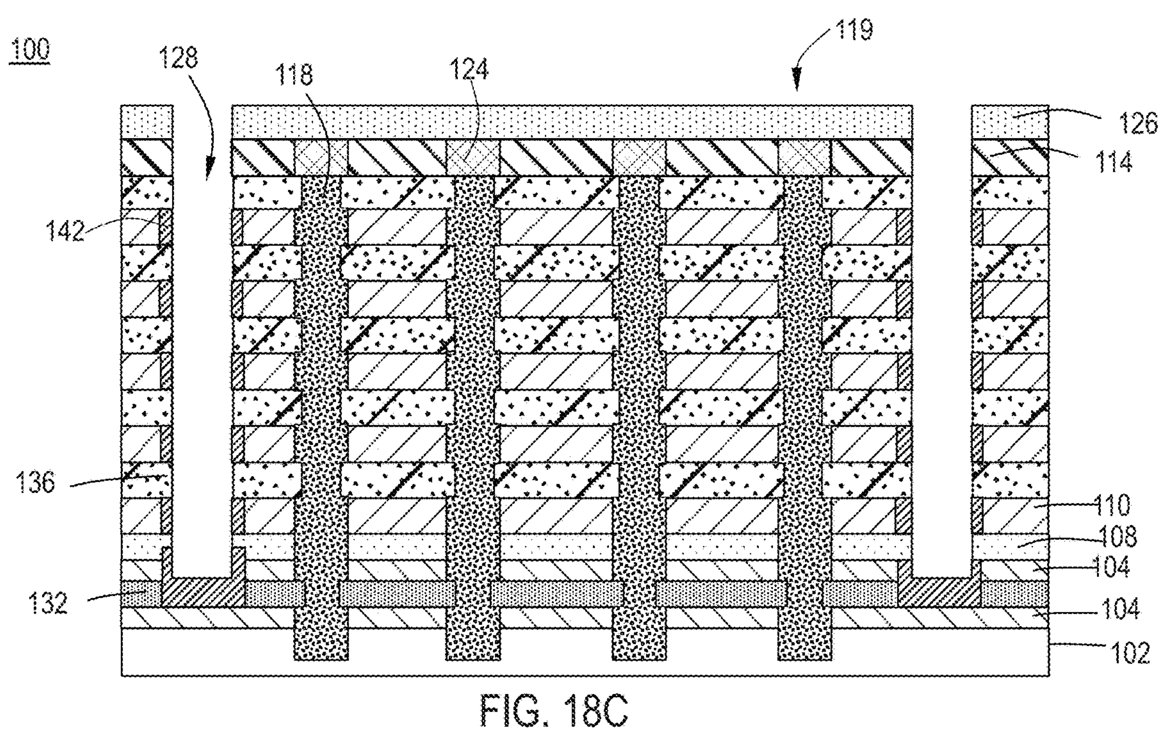
FIG. 18C illustrates a cross-sectional view of an electronic device according to one or more embodiments.

With reference to FIG. 18C, in one or more embodiments, the portion of the metal layer 140 that is unreacted, i.e., the portion of the metal layer 140 that is not converted to metal silicide through annealing, is removed. The unreacted metal layer 140 may be removed by any suitable means known to the skilled artisan. In one or more embodiments, the unreacted metal layer 140 may be removed chemically, e.g., hydrochloride acid (HCl) and hydrogen peroxide ($H_2O_2$).

FIG. 19 shows operation 65 of method 10, where the slit 128 is filled with an insulator material 144. The insulator material 144 may be any suitable material known to the skilled artisan. In one or more embodiments, the filled slit 128 comprises an insulator material 144 selected from one or more of silicon oxide, silicon nitride, and silicon oxynitride. In one or more embodiments, the insulator material 144 is silicon oxide.

Figures 20, 21:
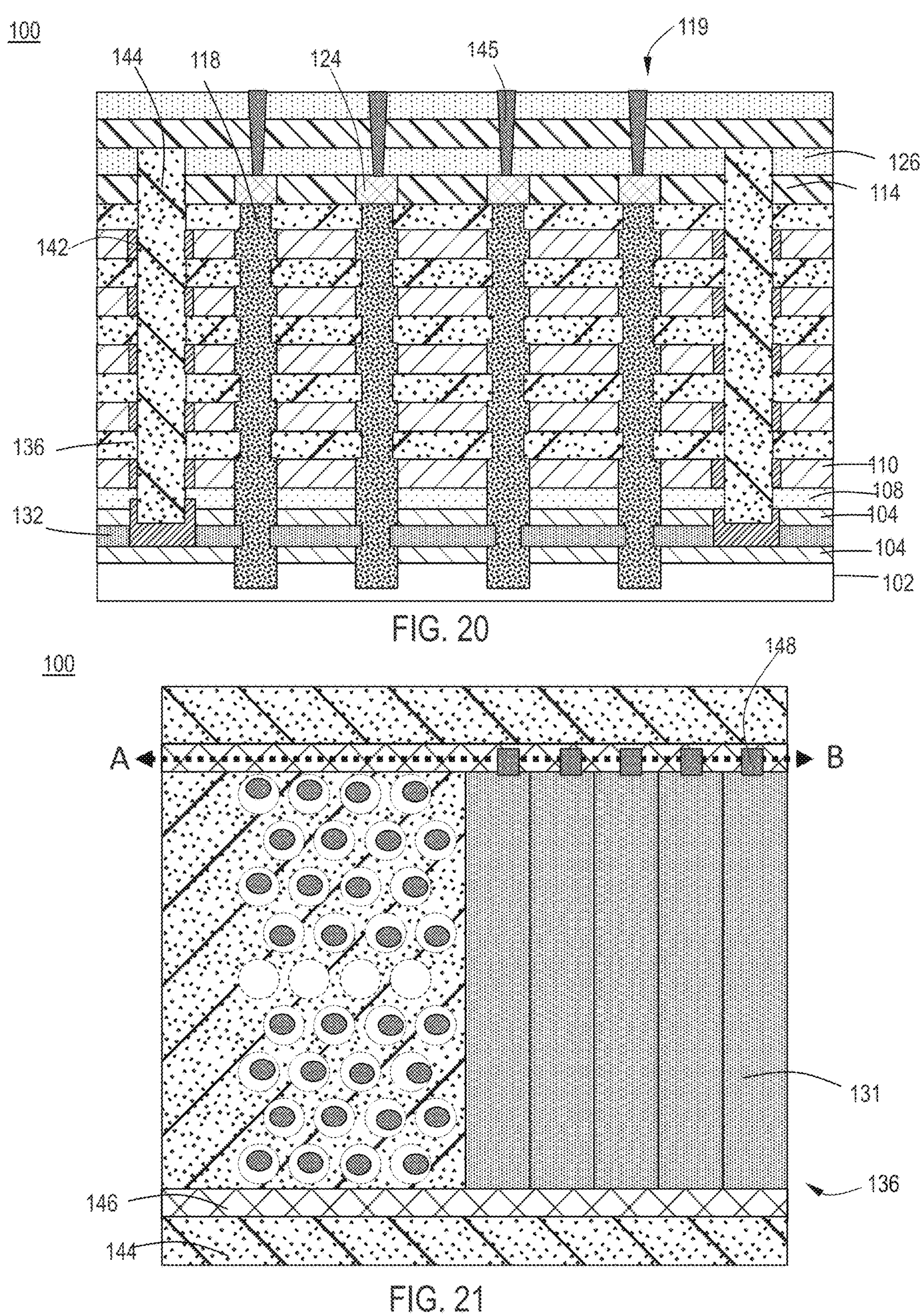
FIG. 20 illustrates a cross-sectional view of an electronic device according to one or more embodiments.
FIG. 21 illustrates a top view of an electronic device according to one or more embodiments.

FIG. 20 shows operation 70 of method 10, wherein bitline pad studs 145 are formed. The bitline studs 145 may be formed by any suitable means known to the skilled artisan.

FIG. 21 shows a top-down view of the device 100. In one or more embodiments, a low resistivity material 146 is formed at a portion of the word line 136 adjacent to filled slit 144. Each level of word line is electrically connected to a word line contact 148. In one or more embodiments, the signal to the word line is transferred through the word line where the lower resistivity material 146 contributes to an increase in transferring speed of the signal.

Figure 22:
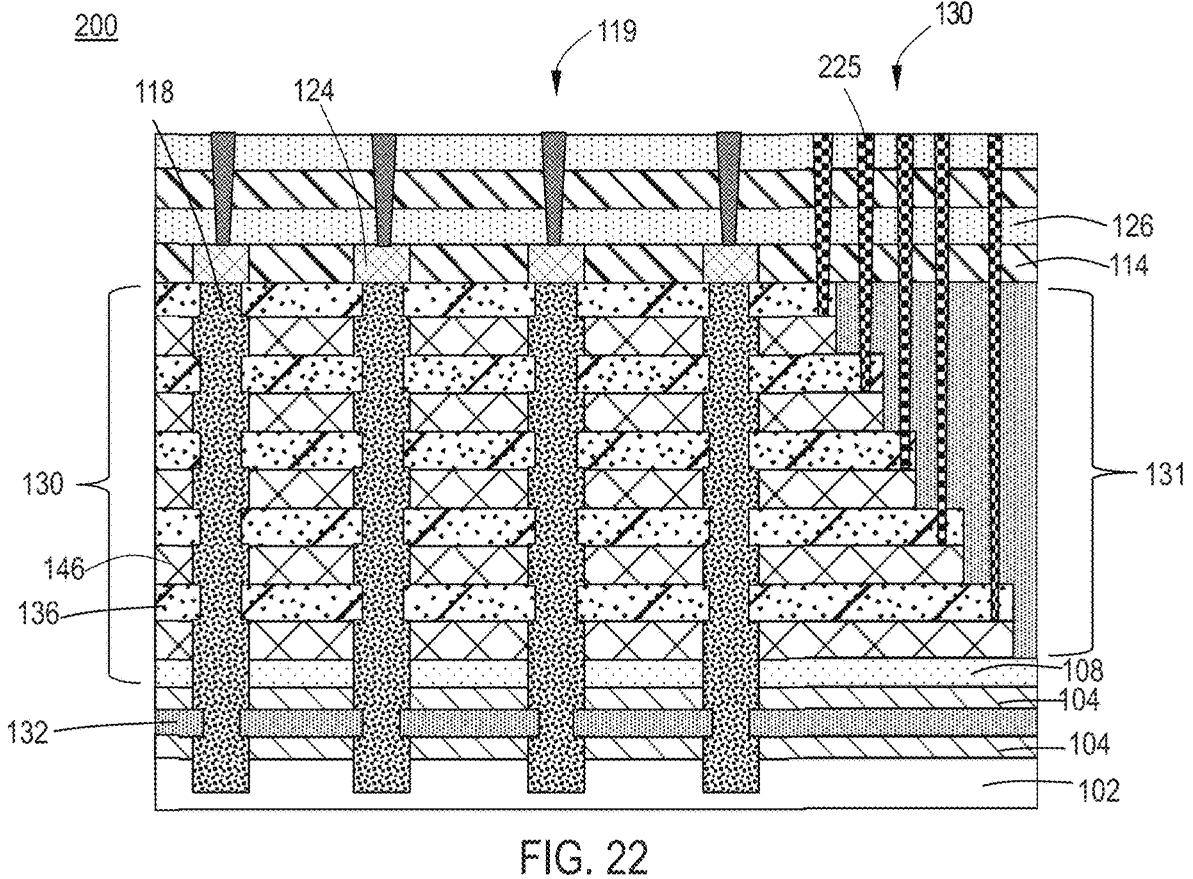
FIG. 22 illustrates a cross-sectional view of an electronic device according to one or more embodiments.

FIG. 22 illustrates a cross-sectional view along line A-B of the electronic device of FIG. 21. FIG. 22 shows operation 75 of method 10 where the word line (W/L) contacts are formed. The word line contacts 225 extend through the memory stack 130 a distance sufficient to terminate at one of the word lines. In the cross-section view illustrated, the low resistance layer 146 is visible. The low resistance layer 146 is formed by the method of one or more embodiments described above. The low resistance layer 146 may comprise a metal silicide layer or may comprise a low resistivity material.

In one or more embodiments, the word line contacts 225 can comprise any suitable material known to the skilled artisan. In one or more embodiments, the word line contacts 225 comprises one or more of a metal, a metal silicide, poly-silicon, amorphous silicon, or EPI silicon. In one or more embodiments, the word line contact 225 is doped by either N type dopants or P type dopants in order to reduce contact resistance. In one or more embodiments, the metal of the word line contacts 225 are selected from one or more of copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt).

Figure 23:
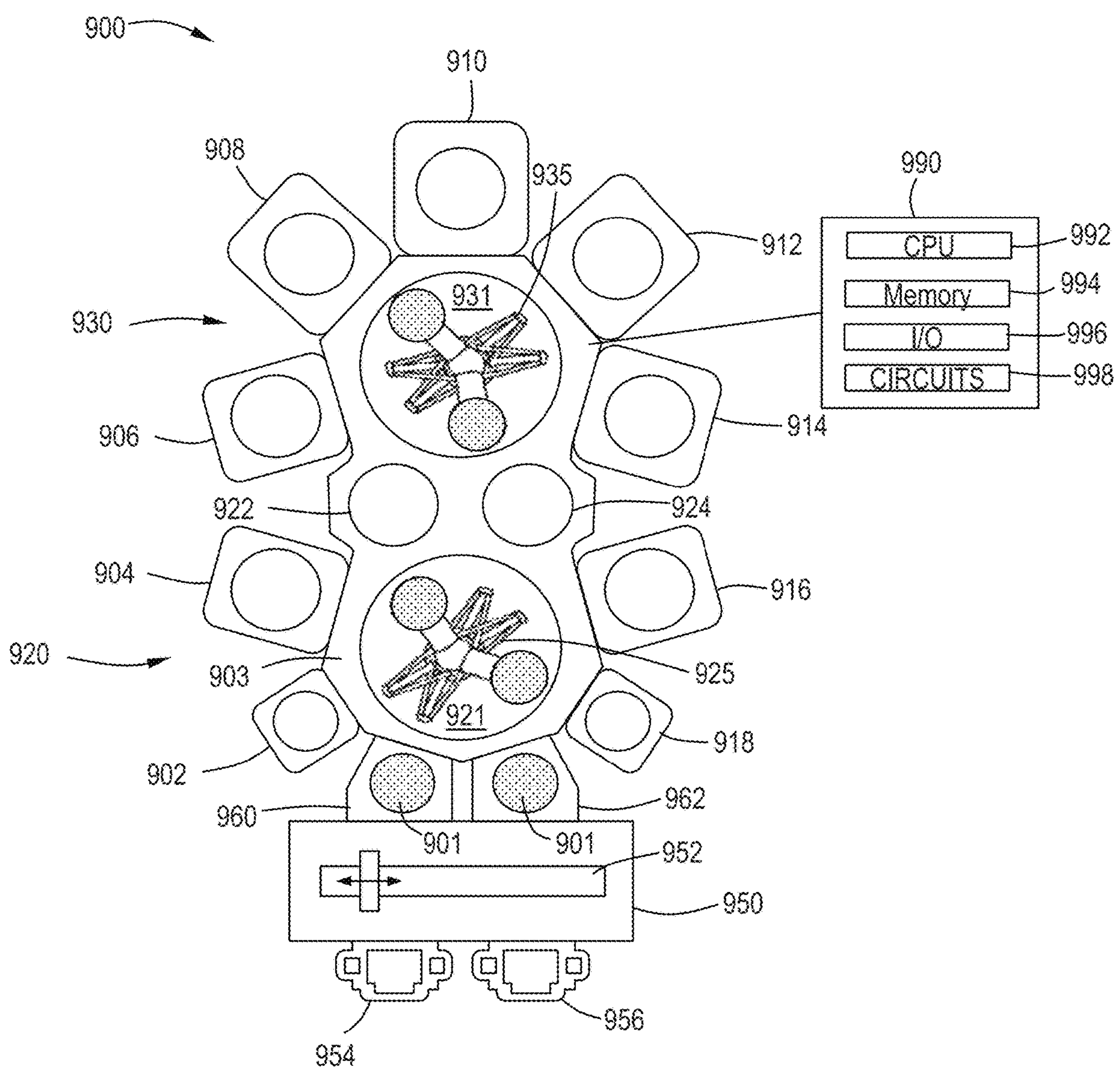
FIG. 23 illustrates a cluster tool according to one or more embodiments.

Additional embodiments of the disclosure are directed to processing tools 900 for the formation of the memory devices and methods described, as shown in FIG. 23.

The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, pre-cleaning chamber, a silicidation chamber, a nitridation chamber, an Ohmic layer deposition chamber, a metal deposition chamber, an annealing chamber, transfer space(s), a wafer orienter/degas chamber, a cryo cooling chamber, a deposition chamber, and an etching chamber. The particular arrangement of process chambers and components can be varied depending on the cluster tool and should not be taken as limiting the scope of the disclosure.

In some embodiments, the cluster tool 900 includes a silicidation chamber, a nitridation chamber, an Ohmic layer deposition chamber, and a metal deposition chamber. In some embodiments, the cluster tool 900 includes a pre-cleaning chamber connected to the central transfer station.

In the embodiment shown in FIG. 23, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930 or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit (CPU) 992, memory 994, inputs/outputs (I/O) 996, and support circuits 998. The controller 990 may control the processing tool 900 directly, or via computers (or controllers) associated with particular process chamber and/or support system components.

In one or more embodiments, the controller 990 may be one of any form of general-purpose computer processor that can be used in an industrial setting for controlling various chambers and sub-processors. The memory 994 or computer readable medium of the controller 990 may be one or more of readily available memory such as non-transitory memory (e.g., random access memory (RAM)), read only memory (ROM), floppy disk, hard disk, optical storage media (e.g., compact disc or digital video disc), flash drive, or any other form of digital storage, local or remote. The memory 994 can retain an instruction set that is operable by the processor (CPU 992) to control parameters and components of the processing tool 900.

The support circuits 998 are coupled to the CPU 992 for supporting the processor in a conventional manner. These circuits include cache, power supplies, clock circuits, input/output circuitry and subsystems, and the like. One or more processes may be stored in the memory 994 as software routine that, when executed or invoked by the processor, causes the processor to control the operation of the processing tool 900 or individual processing units in the manner described herein. The software routine may also be stored and/or executed by a second CPU (not shown) that is remotely located from the hardware being controlled by the CPU 992.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the controller 990 has one or more configurations to execute individual processes or sub-processes to perform the method. The controller 990 can be connected to and configured to operate intermediate components to perform the functions of the methods. For example, the controller 990 can be connected to and configured to control a silicidation chamber.

Processes may generally be stored in the memory 994 of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising one or more of a pre-cleaning chamber, a silicidation chamber, a nitridation chamber, an Ohmic layer deposition chamber, a metal deposition chamber, and an annealing chamber; and a controller connected to the central transfer station and the plurality of process stations, the controller configured to activate the robot to move the wafer between process stations, and to control a process occurring in each of the process stations.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods, and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A semiconductor device comprising:

a memory stack on a common source line, the memory stack comprising alternating silicon oxide layers and word lines, the word lines comprising silicon and a low resistivity material, the low resistivity material selected from the group consisting of tungsten (W), ruthenium (Ru), iridium (Ir), tantalum (Ta), titanium (Ti), platinum (Pt), molybdenum (Mo), nickel (Ni), molybdenum silicide (MoSi), titanium silicide (TiSi), platinum silicide (PtSi), tantalum silicide (TaSi), ruthenium silicide (RuSi);

a filled slit completely filled with an insulator material and extending through the memory stack into the common source line and having a slit region comprising the low resistivity material, the low resistivity material formed at least on an end of the word line facing the slit region and on an end of the common source line facing the slit region; and a plurality of memory strings extending through the memory stack adjacent to the filled slit, wherein each of the plurality of memory strings comprises a plurality of transistor layers.

2. The semiconductor device of claim 1, wherein the low resistivity material has a thickness in a range of from 5 nm to 150 nm.

3. The semiconductor device of claim 1, wherein each of the plurality of transistor layers comprises one or more of a blocking oxide layer, a nitride layer, a tunnel oxide layer, a poly-silicon channel layer, and a core oxide layer.

4. The semiconductor device of claim 3, further comprising a bitline pad on a top surface of the plurality of transistor layers.

5. The semiconductor device of claim 4, further comprising a bitline stud extending from a top surface of the bitline pad.

6. The semiconductor device of claim 1, wherein the low resistivity material has a resistivity in a range of from 5 $\mu\Omega$cm to 100 $\mu\Omega$cm.

7. The semiconductor device of claim 1, where the insulator material is selected from one or more of silicon oxide, silicon nitride, and silicon oxynitride.

8. The semiconductor device of claim 7, wherein the insulator material consists essentially of silicon oxide.

* * * * *